US008581237B2

(12) United States Patent
Ushikubo et al.

(10) Patent No.: US 8,581,237 B2
(45) Date of Patent: Nov. 12, 2013

(54) LIGHT-EMITTING ELEMENT

(75) Inventors: Takahiro Ushikubo, Kanagawa (JP);
Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 878 days.

(21) Appl. No.: 12/639,312

(22) Filed: Dec. 16, 2009

(65) Prior Publication Data
US 2010/0148166 A1    Jun. 17, 2010

(30) Foreign Application Priority Data

Dec. 17, 2008    (JP) .................................. 2008-320934

(51) Int. Cl.
*H01L 51/50*    (2006.01)

(52) U.S. Cl.
USPC .......................................................... 257/40

(58) Field of Classification Search
USPC .................. 257/40, 59, 72; 428/690
See application file for complete search history.

(56) References Cited

U.S. PATENT DOCUMENTS

| | | | |
|---|---|---|---|
| 6,531,234 B1 | 3/2003 | Higashi et al. | |
| 6,803,120 B2 | 10/2004 | Fukuoka et al. | |
| 6,866,947 B1 | 3/2005 | Fukuoka et al. | |
| 7,163,831 B2 * | 1/2007 | Hasegawa et al. | 438/22 |
| 7,173,370 B2 | 2/2007 | Seo et al. | |
| 7,196,360 B2 | 3/2007 | Seo et al. | |
| 7,456,425 B2 | 11/2008 | Seo et al. | |
| 7,982,216 B2 * | 7/2011 | Imai | 257/43 |
| 8,164,545 B2 * | 4/2012 | Kwak | 345/76 |
| 8,232,598 B2 * | 7/2012 | Yamazaki et al. | 257/351 |
| 8,242,508 B2 * | 8/2012 | Hamada et al. | 257/72 |
| 2002/0086180 A1 | 7/2002 | Seo et al. | |
| 2002/0093283 A1 | 7/2002 | Seo et al. | |
| 2002/0109136 A1 | 8/2002 | Seo et al. | |
| 2002/0113546 A1 | 8/2002 | Seo et al. | |
| 2002/0121860 A1 | 9/2002 | Seo et al. | |
| 2002/0139303 A1 | 10/2002 | Yamazaki et al. | |
| 2002/0155632 A1 | 10/2002 | Yamazaki et al. | |
| 2003/0010288 A1 | 1/2003 | Yamazaki et al. | |
| 2004/0154542 A1 | 8/2004 | Yamazaki et al. | |
| 2004/0183082 A1 | 9/2004 | Yamazaki | |
| 2004/0202893 A1 | 10/2004 | Abe | |

(Continued)

FOREIGN PATENT DOCUMENTS

| EP | 1 033 904 A1 | 9/2000 |
|---|---|---|
| EP | 1 182 244 A1 | 2/2002 |

(Continued)

*Primary Examiner* — Nathan Ha
(74) *Attorney, Agent, or Firm* — Husch Blackwell LLP

(57) ABSTRACT

The light-emitting element comprises a first electrode, a second electrode, and a light-emitting layer between the first electrode and the second electrode, in which a first layer, a second layer, and a third layer are stacked from the first electrode side, the first layer contains a first light-emitting substance and a first organic compound, the second layer contains a second light-emitting substance and a second organic compound, the third layer contains the first light-emitting substance and a third organic compound, the amount of the first light-emitting substance is larger than the amount of the first organic compound, the amount of the second organic compound is larger than the amount of the second light-emitting substance, and the amount of the third organic compound is larger than the amount of the first light-emitting substance. A light-emitting element with such a structure can have high emission efficiency.

38 Claims, 18 Drawing Sheets

(56) References Cited

U.S. PATENT DOCUMENTS

| | | |
|---|---|---|
| 2004/0263066 A1 | 12/2004 | Abe et al. |
| 2005/0019606 A1 | 1/2005 | Fukuoka et al. |
| 2005/0129982 A1 | 6/2005 | Fukuoka et al. |
| 2005/0221121 A1 | 10/2005 | Ishihara et al. |
| 2005/0260440 A1 | 11/2005 | Seo et al. |
| 2006/0243970 A1 | 11/2006 | Seo et al. |
| 2007/0075632 A1 | 4/2007 | Kawakami et al. |
| 2007/0134515 A1 | 6/2007 | Fukuoka et al. |
| 2007/0159083 A1 | 7/2007 | Matsuura et al. |
| 2008/0006821 A1 | 1/2008 | Suzuki et al. |
| 2008/0006822 A1 | 1/2008 | Ohsawa |
| 2008/0007164 A1 | 1/2008 | Suzuki et al. |
| 2008/0007165 A1 | 1/2008 | Suzuki et al. |
| 2008/0079001 A1* | 4/2008 | Umezaki et al. ............... 257/59 |
| 2008/0103315 A1 | 5/2008 | Egawa et al. |
| 2008/0142794 A1 | 6/2008 | Shitagaki et al. |
| 2008/0164474 A1* | 7/2008 | Yamazaki et al. ............ 257/59 |
| 2008/0173872 A1* | 7/2008 | Ahn ............................... 257/59 |
| 2008/0231177 A1 | 9/2008 | Nomura et al. |
| 2008/0261075 A1 | 10/2008 | Seo et al. |
| 2008/0268284 A1 | 10/2008 | Kawakami et al. |
| 2009/0072725 A1 | 3/2009 | Suzuki et al. |
| 2009/0079326 A1 | 3/2009 | Seo et al. |
| 2009/0079337 A1* | 3/2009 | Seo et al. .................... 313/504 |
| 2009/0085474 A1 | 4/2009 | Shitagaki et al. |
| 2009/0085479 A1* | 4/2009 | Ushikubo .................... 313/506 |
| 2009/0206331 A1 | 8/2009 | Seo et al. |
| 2009/0236590 A1* | 9/2009 | Ohsawa ........................ 257/40 |
| 2010/0096622 A1 | 4/2010 | Iizumi et al. |
| 2012/0236224 A1* | 9/2012 | Kimura ........................ 349/43 |

FOREIGN PATENT DOCUMENTS

| | | |
|---|---|---|
| EP | 1 718 122 A1 | 11/2006 |
| EP | 1 905 809 A2 | 4/2008 |
| EP | 2 117 063 A1 | 11/2009 |
| JP | 3-190088 | 8/1991 |
| JP | 2000-100566 | 4/2000 |
| JP | 2003-187977 | 7/2003 |
| JP | 2004-356033 | 12/2004 |
| JP | 2005-11734 | 1/2005 |
| JP | 2005-11735 | 1/2005 |
| JP | 2005-285708 | 10/2005 |
| JP | 2006-173050 | 6/2006 |
| JP | 2006-199629 | 8/2006 |
| JP | 2007-91721 | 4/2007 |
| JP | 2007-96023 | 4/2007 |
| JP | 2007-201491 | 8/2007 |
| JP | 2007-227117 | 9/2007 |
| JP | 2007-335214 | 12/2007 |
| JP | 2008-84913 | 4/2008 |
| WO | WO 2005/079118 A1 | 8/2005 |
| WO | WO 2007/029530 A1 | 3/2007 |
| WO | WO 2008/102644 A1 | 8/2008 |

* cited by examiner

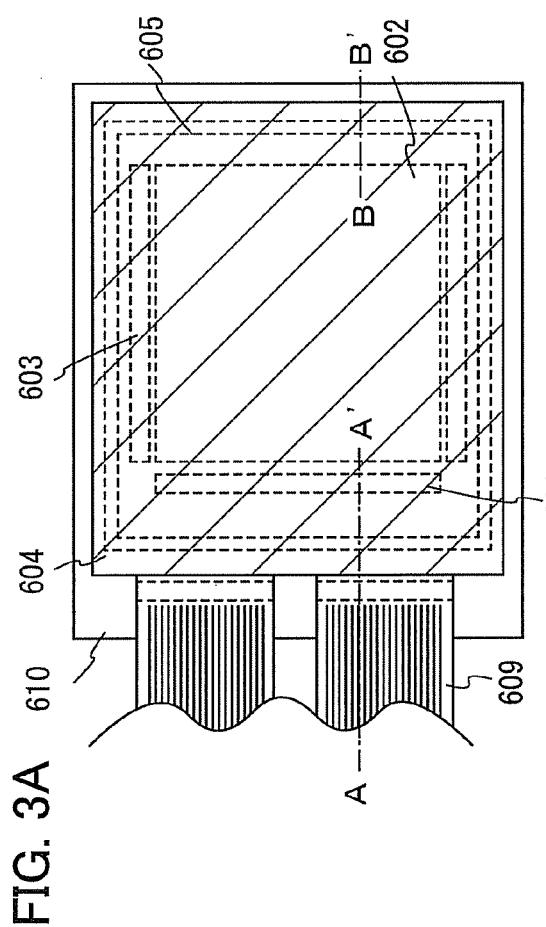
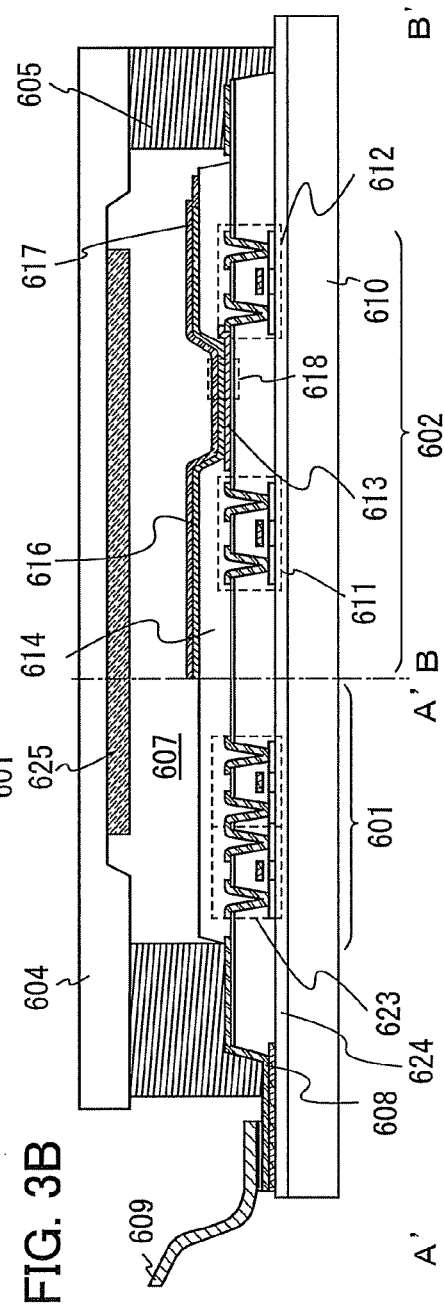
FIG. 3A
FIG. 3B

LIGHT-EMITTING ELEMENT

BACKGROUND OF THE INVENTION

1. Field of the Invention

One embodiment of the present invention relates to a light-emitting element at least part of which includes an organic compound. The present invention also relates to a lighting device, a light-emitting device, and an electronic apparatus which are provided with the light-emitting element.

2. Description of the Related Art

Development of a light-emitting device using a light-emitting element in which a layer containing an organic compound is provided between a pair of electrodes and light emission is obtained by current flowing between the electrodes has been advanced. Such a light-emitting device can be reduced in thickness and weight in comparison with a display device which is currently called a "thin display device". Moreover, such a light-emitting device is of a self-emission type, and therefore, has a high level of visibility and high response speed. Accordingly, such a light-emitting device has been actively developed as a next-generation display device, and has been partly put into practical use at present.

Such a light-emitting element can emit light of various colors depending on a material contained in a layer containing an organic compound, which serves as an emission center. Moreover, by stacking layers containing emission center materials which exhibit different emission colors, emitted light is combined, and more variations of emission colors can be obtained. In particular, the emphasis is put on white light which can be obtained by combining red light, green light, and blue light or combining emission colors which are in a relationship of complementary colors because white light is suitable for the use of a backlight or lighting, in addition to a display.

In recent years, demand for household electric appliances which consume less power has increased in consideration of problems of oil depletion or global warming. There are a wide variety of approaches to reduce power consumption. In the case of using a self-luminous light-emitting element, emission efficiency of the light-emitting element itself is increased, and thus, power consumption can be reduced. Therefore, a large number of studies regarding improvement of emission efficiency of light-emitting elements have been made (for example, see Patent Document 1).

CITATION LIST

[Patent Document]
[Patent Document 1] Japanese Published Patent Application No. 2007-227117

Although a large number of studies have been made as described above, only few light-emitting elements exhibit sufficient emission efficiency; thus, further improvement of emission efficiency has been demanded. Therefore, it is an object of an embodiment of the present invention to provide a light-emitting element with improved emission efficiency.

It is an object of an embodiment of the present invention to provide a light-emitting device or an electronic apparatus with low power consumption.

It is another object of an embodiment of the present invention to provide a light-emitting device or an electronic apparatus with high display quality.

SUMMARY OF THE INVENTION

One example of the invention disclosed in this specification is a light-emitting element including a first electrode, a second electrode, and a layer containing an organic compound between the first electrode and the second electrode. The layer containing an organic compound includes at least a light-emitting layer in which a first layer, a second layer, and a third layer are stacked from the first electrode side. The first layer contains a first light-emitting substance and a first organic compound; the second layer contains a second light-emitting substance and a second organic compound; and the third layer contains the first light-emitting substance and a third organic compound. The amount of the first light-emitting substance is larger than the amount of the first organic compound in the first layer; the amount of the second organic compound is larger than the amount of the second light-emitting substance in the second layer; and the amount of the third organic compound is larger than the amount of the first light-emitting substance in the third layer. A light-emitting element with such a structure can have high emission efficiency.

One example of the invention disclosed in this specification is a light-emitting element including a first electrode, a second electrode, and a layer containing an organic compound between the first electrode and the second electrode. The layer containing an organic compound includes at least a light-emitting layer in which a first layer, a second layer, and a third layer are stacked from the first electrode side. The first layer contains a first light-emitting substance; the second layer contains a second light-emitting substance and a second organic compound; the third layer contains the first light-emitting substance and a third organic compound. The amount of the second organic compound is larger than the amount of the second light-emitting substance in the second layer, and the amount of the third organic compound is larger than the amount of the first light-emitting substance in the third layer. A light-emitting element with such a structure can have high emission efficiency.

One example of the invention disclosed in this specification is a light-emitting element including a first electrode, a second electrode, and a layer containing an organic compound between the first electrode and the second electrode. The layer containing an organic compound includes at least a light-emitting layer in which a first layer, a second layer, and a third layer are stacked from the first electrode side. The first layer contains a first light-emitting substance and a first organic compound; the second layer contains a second light-emitting substance and a second organic compound; the third layer contains the first light-emitting substance and a third organic compound. The rate of the first light-emitting substance in the first layer is higher than or equal to 50 wt % and lower than 100 wt %; the rate of the second organic compound in the second layer is higher than or equal to 50 wt % and lower than 100 wt %; and the rate of the third organic compound in the third layer is higher than or equal to 50 wt % and lower than 100 wt %. A light-emitting element with such a structure can have high emission efficiency.

One example of the invention disclosed in this specification is a light-emitting element including a first electrode, a second electrode, and a layer containing an organic compound between the first electrode and the second electrode. The layer containing an organic compound includes at least a light-emitting layer in which a first layer, a second layer, and a third layer are stacked from the first electrode side, the first layer contains a first light-emitting substance, the second layer contains a second light-emitting substance and a second organic compound, the third layer contains the first light-emitting substance and a third organic compound. The rate of the second organic compound in the second layer is higher than or equal to 50 wt % and lower than 100 wt %, and the rate of the third organic compound in the third layer is higher than or equal to 50 wt % and lower than 100 wt %. A light-emitting element with such a structure can have high emission efficiency.

One example of the invention disclosed in this specification is a light-emitting element which has the above structure and in which the first layer and the second layer have a hole-transporting property, and the third layer has an electron-transporting property. A light-emitting element with such a structure can have high emission efficiency.

One example of the invention disclosed in this specification is a light-emitting element which has the above structure and in which the first light-emitting substance and the second organic compound are materials which have a hole-transporting property, and the third organic compound is a material which has an electron-transporting property. A light-emitting element with such a structure can have high emission efficiency.

One example of the invention disclosed in this specification is a light-emitting element which has the above structure and in which the first light-emitting substance is a compound in which anthracene is bonded to a diarylamino group via an arylene group.

One example of the invention disclosed in this specification is a light-emitting element which has the above structure and in which the first light-emitting substance is a 9,10-diarylanthracene derivative, and an aryl group bonded to the 9 position of the 9,10-diarylanthracene derivative has a diarylamino group.

One example of the invention disclosed in this specification is a light-emitting element which has the above structure and in which the first light-emitting substance is a substance represented by the following general formula (i).

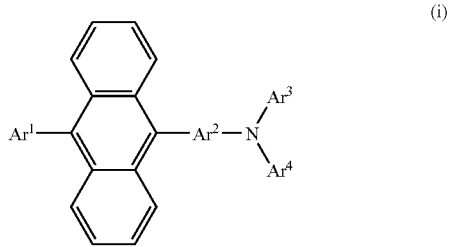

(i)

In the formula, $Ar^1$ represents an aryl group having 6 to 25 carbon atoms, $Ar^2$ represents an arylene group having 6 to 25 carbon atoms, $Ar^3$ and $Ar^4$ independently represent an aryl group having 6 to 25 carbon atoms, or a carbazolyl group.

One example of the invention disclosed in this specification is a light-emitting element which has the above structure and in which a hole-transporting layer is provided in contact with the first layer, and the second organic compound is a condensed polycyclic substance. A light-emitting element with such a structure can have high emission efficiency and an improved lifetime.

One example of the invention disclosed in this specification is a light-emitting element which has the above structure and in which a hole-transporting layer is provided in contact with the first layer, and the second organic compound is a tricyclic, tetracyclic, pentacyclic, or hexacyclic condensed aromatic compound. A light-emitting element with such a structure can have high emission efficiency and an improved lifetime.

One example of the invention disclosed in this specification is a light-emitting element which has the above structure and in which a hole-transporting layer is provided in contact with the first layer, and the second organic compound is an anthracene derivative. A light-emitting element with such a structure can have high emission efficiency and an improved lifetime.

One example of the invention disclosed in this specification is a light-emitting element which has the above structure and in which a peak wavelength of light emitted from the first light-emitting substance is shorter than a peak wavelength of light emitted from the second light-emitting substance. A light-emitting element with such a structure can have high emission efficiency and easily adjust color balance.

One example of the invention disclosed in this specification is a light-emitting element which has the above structure and in which the first light-emitting substance emits blue light, and the second light-emitting substance emits green light. A light-emitting element with such a structure can have high emission efficiency and easily adjust color balance.

One example of the invention disclosed in this specification is a light-emitting element which has the above structure and in which a color of light emitted from the first light-emitting substance and a color of light emitted from the second light-emitting substance are complementary colors. A light-emitting element with such a structure can be a white-light-emitting element which has high emission efficiency and easily adjust color balance.

One example of the invention disclosed in this specification is a light-emitting element which has the above structure and in which the first light-emitting substance emits blue light, and the second light-emitting substance emits yellow light. A light-emitting element with such a structure can be a white-light-emitting element which has high emission efficiency and easily adjust color balance.

One example of the invention disclosed in this specification is a light-emitting element which has the above structure and in which a peak wavelength of light emitted from the first light-emitting substance is in the range of 400 nm to 480 nm, and a peak wavelength of light emitted from the second light-emitting substance is in the range of 540 nm to 600 nm. A light-emitting element with such a structure can be a white-light-emitting element which has high emission efficiency and easily adjust color balance.

One example of the invention disclosed in this specification is a light-emitting element which has the above structure and in which the first light-emitting substance emits blue-green light, and the second light-emitting substance emits red light. A light-emitting element with such a structure can be a white-light-emitting element which has high emission efficiency and easily adjust color balance.

One example of the invention disclosed in this specification is a light-emitting element which has the above structure in which a peak wavelength of light emitted from the first light-emitting substance is in the range of 480 nm to 520 nm, and a peak wavelength of light emitted from the second light-emitting substance is in the range of 600 nm to 700 nm. A light-emitting element with such a structure can be a white-light-emitting element which has high emission efficiency and easily adjust color balance.

One example of the invention disclosed in this specification is a lighting device using a light-emitting element having the above structure. A lighting device with such a structure can be a lighting device which consumes less power.

One example of the invention disclosed in this specification is a light-emitting device provided with a light-emitting element having the above structure, and a means for controlling light emission from the light-emitting element. A light-emitting device with such a structure can be a light-emitting device which consumes less power.

One example of the invention disclosed in this specification is an electronic apparatus with a light-emitting element having the above structure. An electronic apparatus with such a structure can be an electronic apparatus which consumes less power.

By implementing one embodiment of the present invention, a light-emitting element with high emission efficiency can be provided.

By implementing one embodiment of the present invention, a lighting device with low power consumption can be provided.

By implementing one embodiment of the present invention, a light-emitting device or an electronic apparatus with low power consumption can be provided.

Furthermore, by implementing one embodiment of the present invention, a light-emitting device or an electronic apparatus with high display quality can be provided.

BRIEF DESCRIPTION OF THE DRAWINGS

FIGS. 3A and 3B are a top view and a cross-sectional view, respectively, of a light-emitting device according to Embodiment 3.

DETAILED DESCRIPTION OF THE INVENTION

Embodiments of the present invention will be hereinafter described with reference to the accompanying drawings. Note that the present invention can be implemented in many different modes and it is easily understood by those skilled in the art that modes and details of the present invention can be modified in various ways without departing from the purpose and scope of the present invention. Therefore, the present invention should not be interpreted as being limited to the description below of Embodiments.

[Embodiment 1]

Figure 1:
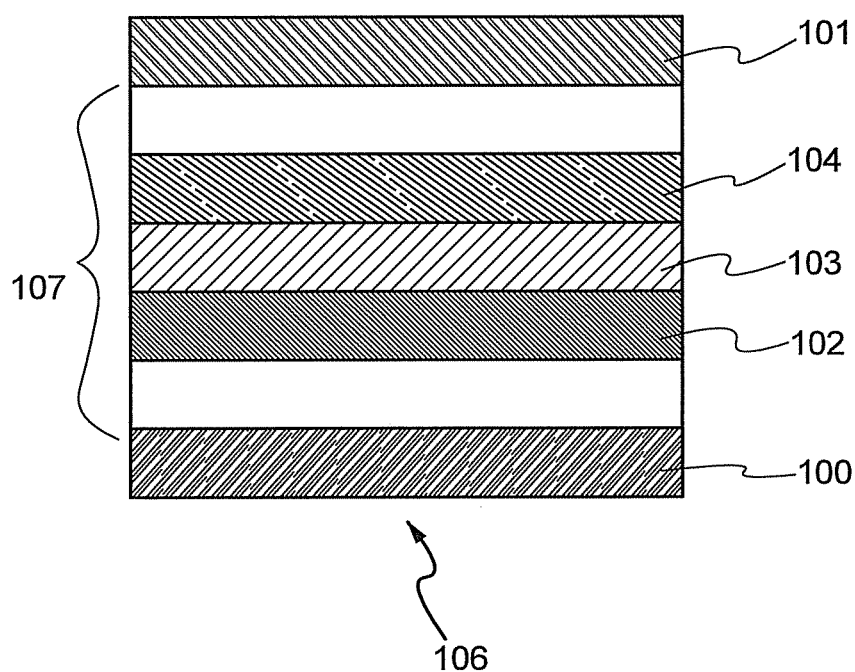
FIG. 1 is a conceptual view of a light-emitting element according to Embodiment 1.

FIG. 1 is a conceptual view of a light-emitting element 106 of this embodiment. A layer 107 containing an organic compound is provided between a first electrode 100 and a second electrode 101. The layer 107 containing an organic compound includes at least a light-emitting layer in which a first layer 102, a second layer 103, and a third layer 104 are stacked in this order from the first electrode 100 side. The first layer 102 contains only a first light-emitting substance or contains both the first light-emitting substance and a first organic compound. The second layer 103 contains a second light-emitting substance and a second organic compound; the third layer 104 contains the first light-emitting substance and a third organic compound. The second organic compound and the third organic compound contained in the second layer 103 and the third layer 104, respectively, serve as a so-called host material into which the respective light-emitting substance is dispersed. In addition, the amount of the second organic compound is larger than that of the second light-emitting substance in the second layer 103, and the amount of the third organic compound is larger than that of the first light-emitting substance in the third layer 104. In specific, the second organic compound and the third organic compound may be contained in the second layer 103 and the third layer 104, respectively, at higher than or equal to 50 wt % and lower than 100 wt %. Meanwhile, the first light-emitting substance is contained at 50 wt % or higher in the first layer 102. The first layer 102 contains only the first light-emitting substance, or contains the first light-emitting substance at higher than or equal to 50 wt % and lower than 100 wt % and the first organic compound. The first organic compound is added to the first layer 102 to play a role of stabilizing film quality of the first layer 102 by suppressing crystallization or the like of the first layer 102. Although there is no limitation on the first organic compound, the first organic compound is preferably a substance having a band gap (or triplet energy, which is an energy gap between a ground state and a triplet excited state, in the case where the first light-emitting substance is a phosphorescent compound) larger than that of the first light-emitting substance, in terms of energy transfer. The light-emitting element described in this embodiment which has the above structure can have high emission efficiency.

When the first layer 102 and the second layer 103 have a hole-transporting property and the third layer 104 has an electron-transporting property, carriers can be recombined in the vicinity of the interface between the second layer 103 and the third layer 104. Electrons which are not recombined at this time are recombined with holes in the first layer 102, whereby the first layer 102 can emit light. Thus, emission efficiency can be improved more effectively. In order to make the first layer 102 and the second layer 103 have a hole-transporting property and to make the third layer 104 have an electron-transporting property, a substance having a hole-transporting property is used as the first light-emitting substance and the second organic compound, and a substance having an electron-transporting property is used as the third organic compound.

Note that the number of electrons flowing to an anode side without being recombined with holes in the light-emitting layer can be decreased when the electrons which are not recombined in the vicinity of the interface between the second layer 103 and the third layer 104 are captured in the first layer 102. One of causes of deterioration of the light-emitting element is the electrons reaching another layer (for example, a hole-transporting layer, a hole-injecting layer, or the like) after flowing to the anode side without being recombined with holes in the light-emitting layer. Thus, a light-emitting element having the structure described in this embodiment is a light-emitting element having a structure in which the degree of deterioration of the element can be reduced.

As a preferable substance as the host material into which a light-emitting substance is dispersed, a condensed polycyclic material such as a condensed polycyclic aromatic compound typified by an anthracene derivative is given. Such a material has a large band gap; thus, excitation energy is difficult to transfer from a light-emitting substance and decline in emission efficiency or deterioration of color purity is unlikely to be caused. Moreover, such a material has either an electron-transporting property or a hole-transporting property depending on a substituent, and can be applied to light-emitting elements with various structures. However, since a skeleton itself of the condensed polycyclic material has an electron-transporting property, the condensed polycyclic material is still capable of transporting electrons to some extent even when it is made to have a high hole-transporting property by a substituent, and thus, deterioration due to a phenomenon in which electrons flow to an anode side without being recombined with holes has become serious depending on conditions, in some cases. In such a case, the deterioration can be suppressed effectively when a light-emitting element having a structure described in this embodiment is applied. Note that as the condensed polycyclic material used as a host material, a tricyclic, tetracyclic, pentacyclic, or hexacyclic condensed aromatic compound is especially effective.

Substances which emit different colors from each other, which are organic compounds, may be used as the first light-emitting substance and the second light-emitting substance. Accordingly, the light-emitting element 106 can emit light in which light emitted from these two kinds of substances overlap, and various emission colors can be obtained. The use of the structure of the light-emitting element 106 of this embodiment makes it possible to obtain a light-emitting element which emits light in a desired color and which has high emission efficiency.

In the case of a light-emitting element using two kinds of light-emitting substances, a phenomenon may occur in which energy transfers from a light-emitting substance which emits light with a shorter wavelength to a light-emitting substance which emits light with a longer wavelength. In such a case, light emission from the light-emitting substance which emits light with a longer wavelength inevitably becomes intense, and it becomes difficult to have balance depending on a combination of colors. Therefore, especially in the structure in which a substance which emits light with a wavelength shorter than that of light emitted from the second light-emitting substance is used as the first light-emitting substance, light with a shorter wavelength emitted from the first light-emitting substance can be obtained by recombination of electrons flowing to an anode side without being recombined with holes in the second layer 103, and holes in the first layer 102. Thus, it becomes easy to balance emission colors of the light-emitting element. Accordingly, a light-emitting element which emits light with a desired emission color can be easily obtained.

Note that the above-described structure of the light-emitting element 106 of this embodiment is very effective in obtaining white light emission. When the structure of the light-emitting element 106 of this embodiment is used, a white-light-emitting element with high emission efficiency in which desired white balance is realized can be obtained. Moreover, in the case where a structure is employed in which a substance which emits light with a wavelength shorter than that of light emitted from the second light-emitting substance is used as the first light-emitting substance in the light-emitting element 106, a light-emitting element with high emission efficiency in which desired white balance is realized can be obtained more easily.

In the case where a white-light-emitting element is manufactured using the structure of the light-emitting element 106 of this embodiment, as a combination of emission colors of the first light-emitting substance and the second light-emitting substance, a combination of colors which are in a relationship of complementary colors, such as red and blue-green, or yellow and blue is preferably used. In particular, a structure in which a substance which emits light with a wavelength shorter than that of light emitted from the second light-emitting substance is used as the first light-emitting substance, for example, a combination of a blue-light emitting substance as the first light-emitting substance and a yellow-light emitting substance as the second light-emitting substance, or a combination of a blue-green-light emitting substance as the first light-emitting substance and a red-light emitting substance as the second light-emitting substance, is preferable because such a structure makes it easy to balance emission colors of the light-emitting element.

In the case where a white-light-emitting element is manufactured using the structure of the light-emitting element 106 of this embodiment, as other examples of the combination of emission colors of the first light-emitting substance and the second light-emitting substance, there are a combination of light whose peak wavelength ranges from 600 nm to 700 nm and light whose peak wavelength ranges from 480 nm to 520 nm, and a combination of light whose peak wavelength ranges from 540 nm to 600 nm and light whose peak wavelength ranges from 400 nm to 480 nm. Needless to say, also in this case, the structure using a substance which emits light with a wavelength shorter than that of light emitted from the second light-emitting substance is used as the first light-emitting substance is preferable because the structure makes it easy to balance emission colors of the light-emitting element.

Next, the light-emitting element described above will be described more specifically with a manufacturing method thereof. Note that an element structure and a manufacturing method described here are just an example, and other known structures, materials, and manufacturing methods can be applied without departing from the purpose of the present invention.

FIG. 1 is a schematic view showing an example of an element structure of the light-emitting element of the present invention. The light-emitting element shown in FIG. 1 has a structure including the layer 107 containing an organic compound, between the first electrode 100 and the second electrode 101. The layer 107 containing an organic compound includes at least the light-emitting layer which is a layered structure in which the first layer 102, the second layer 103, and the third layer 104 are stacked sequentially from the first electrode 100 side. The first layer 102 contains only the first light-emitting substance or contains both the first light-emitting substance and the first organic compound; the second layer 103 contains the second light-emitting substance and the second organic compound as a host material; and the third layer 104 contains the first light-emitting substance and the third organic compound as a host material. A functional layer such as an electron-injecting layer, or an electron-transporting layer may be provided between the light-emitting layer and the second electrode 101 as appropriate, and a functional layer such as a hole-transporting layer or a hole-injecting layer may be provided between the light-emitting layer and the first electrode 100 as appropriate. In this embodiment, the case where the first electrode 100 is an anode and the second electrode 101 is a cathode will be described. Note that the anode in this specification means an electrode which injects holes into a layer containing a light-emitting material and the cathode means an electrode which injects electrons to the layer containing the light-emitting material. Further, the electrode which is in contact with an insulating surface over the substrate over which the light-emitting element is formed may be either the first electrode 100 or the second electrode 101.

In this embodiment, the first electrode 100 is formed in contact with the insulating surface over the substrate over which the light-emitting element is formed. In the case of using the first electrode 100 as an anode, the first electrode 100 is preferably formed using metal, an alloy, a conductive compound each of which has a high work function (specifically, higher than or equal to 4.0 eV), a mixture thereof, or the like. Specifically, for example, indium tin oxide (hereinafter referred to as ITO), indium tin oxide containing silicon or silicon oxide, indium oxide containing zinc oxide (ZnO), indium oxide containing tungsten oxide and zinc oxide (IWZO), and the like are given. Such a conductive metal oxide film is generally formed by sputtering; however, it may be formed by application of a sol-gel method or the like. For example, indium oxide containing zinc oxide (ZnO) can be formed by a sputtering method using a target in which 1 wt % to 20 wt % of zinc oxide is added to indium oxide. In addition, indium oxide containing tungsten oxide and zinc oxide (IWZO) can be formed by a sputtering method using a target in which 0.5 wt % to 5 wt % of tungsten oxide and 0.1 wt % to 1 wt % of zinc oxide are added to indium oxide. Moreover, gold (Au), platinum (Pt), nickel (Ni), tungsten (W), chromium (Cr), molybdenum (Mo), iron (Fe), cobalt (Co), copper (Cu), palladium (Pd), a nitride of a metal material (for example, titanium nitride), or the like can be used.

Subsequently, the layer containing an organic compound is formed. For the layer 107 containing an organic compound, either a low molecular material or a high molecular material can be used. In addition, the material forming the layer 107 containing an organic compound is not limited to a material containing only an organic compound material, and may partially contain an inorganic compound. In addition, the layer 107 containing an organic compound is generally formed of a combination of functional layers as appropriate, such as a hole-injecting layer, a hole-transporting layer, a hole blocking layer, a light-emitting layer, an electron-transporting layer, and an electron-injecting layer. The layer 107 containing an organic compound may include a layer having two or more functions of the above layers, or any of the above layers, except for the light-emitting layer, may not be formed. Needless to say, a layer other than the above-described functional layers may be provided. In this embodiment, description is made using a light-emitting element, as an example, in which a stacked layer including a hole-injecting layer, a hole-transporting layer, a light-emitting layer (a layered structure including the first layer 102, the second layer 103, and the third layer 104), an electron-transporting layer, and an electron-injecting layer in this order from the anode side is used as the layer 107 containing an organic compound.

In the case of using a hole-injecting layer, metal oxide such as vanadium oxide, molybdenum oxide, ruthenium oxide, and aluminum oxide, and the like are given as a material which functions as the hole-injecting layer. Alternatively, a porphyrin-based compound is effective among organic compounds, and phthalocyanine (abbreviation: $H_2Pc$), copper phthalocyanine (abbreviation: CuPc), or the like can be used. A high molecular compound (for example, an oligomer, a dendrimer, or a polymer) can be used as well for the hole-injecting layer. For example, high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), and poly[N,N'-bis(4-butylphenyl)-N,N'-bis(phenyl)benzidine (abbreviation: Poly-TPD) are given. In addition, a high molecular compound mixed with acid such as poly(3,4-ethylenedioxythiophene)/poly(styrenesulfonic acid) (abbreviation: PEDOT/PSS) or polyaniline/poly(styrenesulfonic acid) (PAni/PSS) can be used. The hole-injecting layer is formed in contact with the anode, and with use of the hole-injecting layer, a carrier injection barrier is reduced and carriers are efficiently injected into the light-emitting element, which results in reduction of driving voltage.

Alternatively, for the hole-injecting layer, a material in which an acceptor substance is contained in a substance having a high hole-transporting property (hereinafter, the material is referred to as a "composite material") can be used. Note that, by use of the substance having a high hole-transporting property containing an acceptor substance, the substance can have an ohmic contact with an electrode and a material used to form an electrode may be selected regardless of its work function. In other words, besides a material having a high work function, a material with a low work function can be used for the anode. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxide of metal that belongs to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because they have a high electron accepting property. Among these, molybdenum oxide is especially preferable because it is stable in air, its hygroscopic property is low, and it can be easily treated.

Note that, in this specification, the term "composition" means not only a simple mixture of two materials but also a mixture of a plurality of materials in a condition where an electric charge is given and received between the materials.

As a substance having a high hole-transporting property used for the composite material, various compounds such as an aromatic amine compound, a carbazole derivative, aromatic hydrocarbon, and a high molecular compound (such as oligomer, dendrimer, or polymer) can be used. A substance having a hole mobility of higher than or equal to $10^{-6}$ cm$^2$/Vs is preferably used as a substance having a high hole-transporting property used for the composite material. However, substances other than the above-described substances can be used as long as the hole-transporting property thereof is higher than the electron-transporting property thereof. An organic compound which can be used as a substance having a high hole-transporting property for the composite material will be specifically given below.

For example, as the aromatic amine compound which can be used for the composite material, the following can be given: 4,4'-bis[N-(1-naphthyl)-N-phenylamino]biphenyl (abbreviation: NPB or α-NPD); N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); N,N'-bis[4-[bis(3-methylphenyl)amino]phenyl]-N,N'-diphenyl-[1,1'-biphenyl]-4,4'-diamine (abbreviation: DNTPD); 1,3,5-tris[N-(4-diphenylaminophenyl)-N-phenylamino]benzene (abbreviation: DPA3B); and the like.

As the carbazole derivative which can be used for the composite material, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, as the carbazole derivative which can be used for the composite material, 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CzPA); 1,4-bis[4-(N-carbazolyl)phenyl]-2,3,5,6-tetraphenylbenzene; or the like can be used.

As the aromatic hydrocarbon which can be used for the composite material, the following can be given for example: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides these, pentacene, coronene, or the like can also be used. As described above, the aromatic hydrocarbon which has a hole mobility of higher than or equal to $1\times10^{-6}$ cm$^2$/Vs and which has 14 to 42 carbon atoms is particularly preferable.

The aromatic hydrocarbon which can be used for the composite material may have a vinyl skeleton. As the aromatic hydrocarbon having a vinyl group, the following can be given as examples: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Alternatively, a composite material which contains the above-described high molecular compound such as PVK, PVTPA, PTPDMA, or Poly-TPD and the above-described substance with an acceptor property may be used as the hole-injecting layer.

When the composite material described above is used for the hole-injecting layer, various kinds of metal, alloys, electrically conductive compounds or mixture thereof can be used for the anode, regardless of the work function. Therefore, for example, aluminum (Al), silver (Ag), an aluminum alloy (Al—Si), or the like can be used for the anode, in addition to the above-described materials. In addition, an element belonging to Group 1 or Group 2 in the periodic table, which is a low work function material, that is, alkali metal such as lithium (Li) or cesium (Cs), alkaline earth metal such as magnesium (Mg), calcium (Ca), or strontium (Sr), an alloy containing these metals (Mg—Ag or Al—Li), rare earth metal such as europium (Eu) or ytterbium (Yb), an alloy containing such rare earth metal, or the like can be used. A film of alkali metal, alkaline earth metal, or an alloy containing these metals can be formed by a vacuum evaporation method. In addition, a film of an alloy containing alkali metal or alkaline earth metal can be formed by sputtering. Moreover, a film of silver paste or the like can be formed by an ink-jet method or the like.

For the hole-transporting layer, appropriate materials such as N,N'-bis(spiro-9,9'-bifluoren-2-yl)-N,N'-diphenylbenzidine (abbreviation: BSPB); 4,4'-bis[N-(1-naphthyl)-N-phenylamino]biphenyl (abbreviation: NPB or α-NPD); 4,4'-bis[N-(3-methylphenyl)-N-phenylamino]biphenyl (abbreviation: TPD); 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); N,N'-bis[4-[bis(3-methylphenyl)amino]phenyl]-N,N'-diphenyl-[1,1'-biphenyl]-4,4'-diamine (abbreviation: DNTPD); 1,3,5-tris[N,N-di(m-tolyl)amino]benzene (abbreviation: m-MTDAB); 4,4',4"-tris(N-carbazolyl)triphenylamine (abbreviation: TCTA); phthalocyanine (abbreviation: H$_2$Pc); copper phthalocyanine (abbreviation: CuPc); or vanadyl phthalocyanine (abbreviation: VOPc) can be used. Although a substance having a hole mobility of higher than or equal to $10^{-6}$ cm$^2$/Vs is preferably used for the hole-transporting layer, any substance can be used for the hole-transporting layer as long as the hole-transporting property thereof is higher than the electron-transporting property thereof. Moreover, the hole-transporting layer is not limited to a single-layer structure, and may be formed as a multilayer structure in which two or more layers formed of substances which satisfy the above-described conditions are mixed. The hole-transporting layer can be formed by a vacuum evaporation method, or the like.

As the hole-transporting layer, a high molecular compound such as PVK, PVTPA, PTPDMA, or Poly-TPD can be used. In this case, a solution process such as an ink-jet method or a spin coating method can be used.

Note that the hole-transporting layer which is in contact with the light-emitting layer is preferably formed using a substance having an excitation energy higher than that of the first light-emitting substance. Such a structure makes it possible to suppress energy transfer from the light-emitting layer to the hole-transporting layer and suppress reduction in emission efficiency.

In the light-emitting layer, the first layer 102, the second layer 103, and the third layer 104 are stacked from the first electrode 100 side. The first layer 102 contains only the first light-emitting substance or contains both the first light-emitting substance and the first organic compound. The second layer 103 contains the second light-emitting substance and the second organic compound. The second organic compound serves as a so-called host material into which the light-emitting substance is dispersed, and the amount thereof is larger than that of the second light-emitting substance. In specific, the second organic compound may be contained in the second layer 103 at higher than or equal to 50 wt % and lower than 100 wt %. The third layer 104 contains the first light-emitting substance and the third organic compound. The third organic compound serves as a so-called host material into which the light-emitting substance is dispersed, and the amount thereof is larger than that of the first light-emitting substance. In specific, the third organic compound may be contained in the third layer 104 at higher than or equal to 50 wt % and lower than 100 wt %. Meanwhile, the first light-emitting substance is contained at 50 wt % or higher in the first layer 102. The first layer 102 contains only the first light-emitting substance, or contains the first light-emitting substance at higher than or equal to 50 wt % and lower than 100 wt % and the first organic compound. The first organic compound is added to the first layer 102 to play a role of stabilizing film quality of the first layer 102 by suppressing crystallization or the like of the first layer 102. Although there is no limitation on the first organic compound, the first organic compound is preferably a substance having a band gap (or triplet energy, which is an energy gap between a ground state and a triplet excited state, in the case where the first light-emitting substance is a phosphorescent compound) larger than that of the first light-emitting substance, in terms of energy transfer. The light-emitting element described in this embodiment which has the above structure can have high emission efficiency. The light-emitting layer can be formed by a vacuum evaporation method, and it can be formed by a co-evaporation method in which different materials are evaporated at the same time.

The first light-emitting substance and the second light-emitting substance are each a substance which serves as an emission center, and substances which emit light with different wavelengths from each other are selected for the first light-emitting substance and the second light-emitting substance. Although examples of the substance which serves as an emission center are given below, needless to say, the substance which serves as an emission center is not limited thereto. As examples of substances which exhibits blue light emission (emission wavelength: 400 nm to 480 nm), there are N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl)phenyl]-9H-carbazol-3-amine (abbreviation: PCAPA); 4-(10-phenyl-9-anthryl)-4'-(9-phenyl-9H-carbazol-3-yl)triphenylamine (abbreviation: PCBAPA); 4-[4-(10-phenyl-9-anthryl)phenyl]-4'-(9-phenyl-9H-carbazol-3-yl)triphenylamine (abbreviation: PCBAPBA); perylene; 2,5,8,11-tetra(tert-butyl)perylene (abbreviation: TBP); and the like. In addition, materials which emit phosphorescence, such as bis[2-(4',6'-difluorophenyl)pyridinato-N,$C^{2'}$]iridium(III)tetrakis(1-pyrazolyl) borate (abbreviation: FIr6) and bis[2-(4',6'-difluorophenyl)pyridinato-N,$C^{2'}$]iridium(III)picolinate (abbreviation: FIrpic) can be used. As examples of substances which exhibit blue-green light emission (emission wavelength: 480 nm to 520 nm), there are N,N'''-(2-tert-butylanthracene-9,10-diyldi-4,1-phenylene)bis[N,N',N'-triphenyl-1,4-phenylenediamine] (abbreviation: DPABPA); N,9-diphenyl-N-[4-(9,10-diphenyl-2-anthryl)phenyl]-9H-carbazol-3-amine (abbreviation: 2PCAPPA); N-[4-(9,10-diphenyl-2-anthryl) phenyl]-N,N',N'-triphenyl-1,4-phenylenediamine (abbreviation: 2DPAPPA); N,N,N',N',N'',N''',N'''-octaphenyldibenzo[g,p]chrysene-2,7,10,15-tetramine (abbreviation: DBC1); coumarin 30; and the like. In addition, materials which emit phosphorescence, such as bis[2-(3',5'-bistrifluoromethylphenyl)pyridinato-N,$C^{2'}$]iridium(III)picolinate (abbreviation: Ir(CF$_3$ppy)$_2$(pic)); and bis[2-(4',6'-difluorophenyl)pyridinato-N,$C^{2'}$]iridium(III)acetylacetonate (FIracac); can be used. As examples of substances which exhibits green light emission, there are N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); 9,10-bis(1,1'-biphenyl-2-yl)-N-[4-(9H-carbazol-9-yl)phenyl]-N-phenylanthracene-2-amine (abbreviation: 2YGABPhA); N,N,9-triphenylanthracen-9-amine (abbreviation: DPhAPhA); coumarin 545T; N,N'-diphenylquinacridone (abbreviation: DPQd); and the like. In addition, materials which emit phosphorescence, such as tris (2-phenylpyridinato)iridium(III) (abbreviation: Ir(ppy)$_3$), bis (2-phenylpyridinato)iridium(III)acetylacetonate (abbreviation: Ir(ppy)$_2$(acac)), or tris(acetylacetonato)(monophenanthroline)terbium(III) (abbreviation: Tb(acac)$_3$(Phen)) can be used. As examples of substances which exhibit yellow light emission (emission wavelength: 540 nm to 600 nm), there are rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2); and the like. In addition, materials which emit phosphorescence, such as bis(benzo[h]quinolinato)iridium(III) acetylacetonate (abbreviation: Ir(bzq)$_2$(acac)); bis(2,4-diphenyl-1,3-oxazolato-N,$C^{2'}$)iridium(III)acetylacetonate (abbreviation: Ir(dpo)$_2$(acac)); bis[2-(4'-perfluorophenylphenyl)pyridinato]iridium(III)acetylacetonate (abbreviation: Ir(p-PF-ph)$_2$(acac)); or bis(2-phenylbenzothiazolato-N,$C^{2'}$)iridium(III)acetylacetonate (abbreviation: Ir(bt)$_2$(acac)) can be used. As examples of substances which exhibit red light emission (emission wavelength: 600 nm to 700 nm), there are N,N,N',N'-tetrakis(4-methylphenyl)tetracene-5,11-diamine (abbreviation: p-mPhTD); 7,14-diphenyl-N,N,N',N'-tetrakis(4-methylphenyl)acenaphtho[1,2-a]fluoranthene-3,10-diamine (abbreviation: p-mPhAFD); {2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI); {2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 4-(dicyanomethylene)-2,6-bis[p-(dimethylamino)styryl]-4H-pyran (abbreviation: BisDCM); {2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM); and the like. In addition, materials which emit phosphorescence, such as bis[2-(2'-benzo[4,5-α]thienyl)pyridinato-N,$C^3$]iridium (III)acetylacetonate (abbreviation: Ir(btp)$_2$(acac)); bis(1-phenylisoquinolinato-N,C$^2$')iridium(III)acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); 2,3,7,8,12,13,17,18-octaethyl-21H,23H-porphyrinplatinum(II) (abbreviation: PtOEP); tris(1,3-diphenyl-1,3-propanedionato)(monophenanthroline)europium (III) (abbreviation: Eu(DBM)$_3$(Phen)); or tris[1-(2-thenoyl)-3,3,3-trifluoroacetonato](monophenanthroline)europium (III) can be used. Note that, although materials which emit light with a wavelength of 520 nm to 540 nm are not given, it is needless to say that light-emitting materials (including materials which emit phosphorescence in its category) with an emission wavelength of this range can be used. Substances which have different emission wavelengths can be selected from these substances to be used so that a desired emission color can be obtained from the light-emitting element. Examples of the combinations are as follows. When 2YGAPPA is used as the first light-emitting substance and rubrene is used as the second light-emitting substance, white color can be obtained; when 2PCAPPA is used as the first light-emitting substance and BisDCM is used as the second light-emitting substance, white color can be obtained; when 2YGAPPA is used as the first light-emitting substance and BisDCM is used as the second light-emitting substance, purple color can be obtained; and when PCBAPA is used as the first light-emitting substance and 2PCAPA is used as the second light-emitting substance, an intermediate color such as blue-green can be obtained.

Note that, since the first light-emitting substance is preferably a substance having a hole-transporting property, the following examples can be given: PCBAPA, PCBAPBA, DPABPA, YGAPA, PCAPA, 2PCAPPA, 2YGAPPA, and 2DPAPPA. In particular, a compound in which anthracene is bonded to a diarylamino group via an arylene group is a preferable material. Among them, a 9,10-diarylanthracene derivative is preferably used in which an aryl group bonded to the 9 position thereof has a diarylamino group, that is, a substance represented by the following general formula (i).

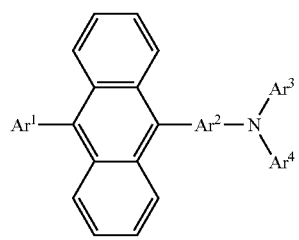

(i)

In the formula, Ar$^1$ represents an aryl group having 6 to 25 carbon atoms, Ar$^2$ represents an arylene group having 6 to 25 carbon atoms, and Ar$^3$ and Ar$^4$ independently represent an aryl group having 6 to 25 carbon atoms or a carbazolyl group. Ar$^3$ and Ar$^4$ independently may have a substituent, and in that case, as the substituent, an alkyl group having 1 to 4 carbon atoms, an aryl group having 6 to 25 carbon atoms, or a carbazolyl group are given. As the aryl group having 6 to 25 carbon atoms, for example, a phenyl group, an o-biphenyl group, a m-biphenyl group, a p-biphenyl group, a fluoren-2-yl group, a spiro-9,9'-bifluoren-2-yl group, a naphthyl group and the like are given. In addition, as an arylene group having 6 to 25 carbon atoms, for example, a divalent group or the like derived from benzene, naphthalene, fluorine, or spirofluorene is given. Further, as an alkyl group having 1 to 4 carbon atoms, for example, a methyl group, an ethyl group, a propyl group, an isopropyl group, a butyl group, an isobutyl group, a tert-butyl group and the like are given.

As examples of such a substance that can be preferably used for the first light-emitting substance, 4-(10-phenyl-9-anthryl)-4'-(9-phenyl-9H-carbazol-3-yl)triphenylamine (abbreviation: PCBAPA) represented by the structural formula (1), 4-[4-(10-phenyl-9-anthryl)phenyl]-4'-(9-phenyl-9H-carbazol-3-yl)triphenylamine (abbreviation: PCBAPBA) represented by the structural formula (2), N,9-diphenyl-N-[4-(10-phenyl-9-anthryl)phenyl]-9H-carbazol-3-amine (abbreviation: PCAPA) represented by the structural formula (3), and the like are given.

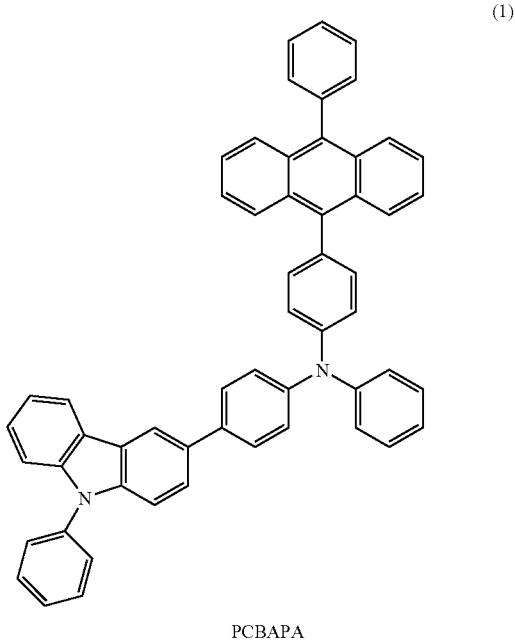

PCBAPA (1)

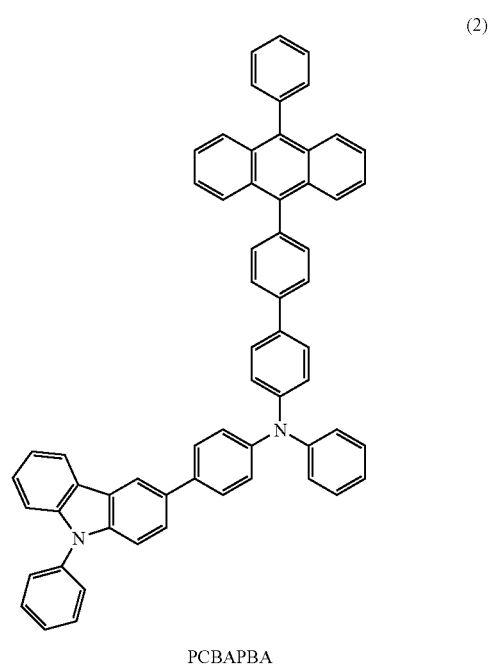

PCBAPBA (2)

(3)

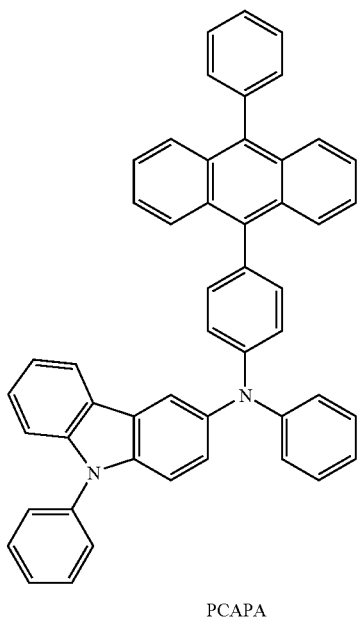

PCAPA

Further, if the substance which emits light with a shorter wavelength is used as the first light-emitting substance and the substance which emits light with a longer wavelength is used as the second light-emitting substance, light with shorter wavelength emitted from the first light-emitting substance can be obtained by recombination of electrons flowing to the anode side without being recombined with holes in the second layer 103, and holes in the first layer 102. Thus, it becomes easy to balance emission colors of the light-emitting element. Accordingly, a light-emitting element which exhibits a desired emission color and whose degree of deterioration with driving time is improved can be easily obtained. Such a structure is effective especially in adjusting white balance of a white-light-emitting element.

Crystallization of the first light-emitting substance is suppressed and the film quality of the first layer is improved by adding the first organic compound to the first light-emitting substance. Thus, there are no particular limitation on the material, but for example, the following can be used: 4,4'-bis[N-(1-naphthyl)-N-phenylamino]biphenyl (abbreviation: NPB or α-NPD); N,N'-bis(4-methylphenyl)-N,N'-diphenyl-p-phenylenediamine (abbreviation: DTPPA); 9,10-bis(3,5-diphenylphenyl)anthracene (abbreviation: DPPA); 4,4'-bis[N-(4-diphenylaminophenyl)-N-phenylamino]biphenyl (abbreviation: DPAB); N,N'-bis[4-[bis(3-methylphenyl)amino]phenyl]-N,N'-diphenyl-[1,1'-biphenyl]-4,4'-diamine (abbreviation DNTPD); 1,3,5-tris[N-(4-diphenylaminophenyl)-N-phenylamino]benzene (abbreviation: DPA3B); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenyl-carbazol-3-yl)amino]-9-phenylcarbazole (abbreviation: PCzPCN1); 4,4'-di(N-carbazolyl)biphenyl (abbreviation: CBP); 1,3,5-tris[4-(N-carbazolyl)phenyl]benzene (abbreviation: TCPB); 4,4',4"-tris(N-carbazolyl)triphenylamine (abbreviation: TCTA); 9-[4-(10-phenyl-9-anthryl)phenyl]-9H-carbazole (abbreviation: CzPA); 9-phenyl-9'-[4-(10-phenyl-9-anthryl)phenyl]-3,3'-bi(9H-carbazole) (abbreviation: PCCPA); 1,4-bis[4-(N-carbazolyl)phenyl]-2,3,5,6-tetraphenylbenzene; 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl) anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; pentacene; coronene; 4,4'-bis(2,2-diphenylvinyl)biphenyl (abbreviation: DPVBi); 9,10-bis[4-(2,2-diphenylvinyl)phenyl]anthracene (abbreviation: DPVPA), and the like. Note that if the band gap (or triplet energy) of the first organic compound is smaller than that of the first light-emitting substance, energy is transferred from the first light-emitting substance to the first organic compound, emission efficiency and color purity may be decreased. Thus, the first organic compound is preferably a substance having a band gap (or triplet energy) larger than that of the first light-emitting substance.

As the second organic compound and the third organic compound, the following examples can be given: metal complexes such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), bis(2-methyl-8-quinolinolato)(4-phenylphenolato)aluminum (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), bathocuproine (abbreviation: BCP), 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. The following is specifically given as the condensed polycyclic aromatic compound: 9,10-diphenylanthracene (abbreviation: DPAnth); N,N-diphenyl-9-[4-(10-phenyl-9-anthryl)phenyl]-9H-carbazol-3-amine (abbreviation: CzA1PA); 4-(10-phenyl-9-anthryl)triphenylamine (abbreviation: DPhPA); 4-(9H-carbazol-9-yl)-4'-(10-phenyl-9-anthryl)triphenylamine (abbreviation: YGAPA); N,9-diphenyl-N-[4-(10-phenyl-9-anthryl)phenyl]-9H-carbazol-3-amine (abbreviation: PCAPA); N,9-diphenyl-N-{4-[4-(10-phenyl-9-anthryl)phenyl]phenyl}-9H-carbazol-3-amine (abbreviation: PCAPBA); N-9-diphenyl-N-(9,10-diphenyl-2-anthryl)-9H-carbazol-3-amine (abbreviation: 2PCAPA); 9-phenyl-9'-[4-(10-phenyl-9-anthryl)phenyl]-3,3'-bi(9H-carbazole) (abbreviation: PCCPA); 4-(10-phenyl-9-anthryl)-4'-(9-phenyl-9H-carbazol-3-yl)triphenylamine (abbreviation: PCBAPA); 6,12-dimethoxy-5,11-diphenylchrysene, N,N,N',N',N",N",N''',N'''-octaphenyldibenzo[g,p]chrysene- 2,7,10,15-tetramine (abbreviation: DBC1); 9-[4-(10-phenyl-9-anthryl)phenyl]-9H-carbazole (abbreviation: CzPA); 3,6-diphenyl-9-[4-(10-phenyl-9-anthracenyl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tent-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3) and the like. A substance having a band gap larger than that of the light-emitting substances which are dispersed into the second organic compound and the third organic compound may be selected from these substances and known substances. Moreover, in the case where a light-emitting substance emits phosphorescence, a substance having a triplet energy (energy difference between a ground state and a triplet excitation state) which is higher than that of the light-emitting substance may be selected as a host material.

Note that the first light-emitting substance, the first organic compound, and the second organic compound are preferably a material having a hole-transporting property, and the third organic compound is preferably a material having an electron-transporting property. As the material having a hole-transporting property, the following can be given: the above-described aromatic amine compounds and condensed polycyclic aromatic compounds such as DPAnth, CzA1PA, DPhPA, YGAPA, PCAPA, PCAPBA, 2PCAPA, and DBC1. As the materials having an electron-transporting property, the following can be given: the above-described heterocyclic compounds and condensed polycyclic aromatic compounds such as CzPA, DPCzPA, DPPA, DNA, t-BuDNA, BANT, DPNS, DPNS2, and TPB3.

Among the above-described substances, the condensed polycyclic compounds particularly have a large band gap and can be preferably used as a host material into which a light-emitting substance is dispersed; however, even if the condensed polycyclic aromatic compounds are used as the material having a hole-transporting property, it has ability to transport a certain amount of electrons and deterioration due to electrons flowing to reach the hole-transporting layer without being recombined with holes is increased in some cases. Therefore, in the case where DPAnth, CzA1PA, DMA, YGAPA, PCAPA, PCAPBA, 2PCAPA, DBC1, PCBAPA, PCCPA, or the like which is the condensed polycyclic aromatic compound having a hole-transporting property is used as the second organic compound, deterioration can be suppressed very effectively by use of the structure of the light-emitting element in this embodiment.

In the case of using an electron-transporting layer, it is provided between the light-emitting layer and an electron-injecting layer. As suitable materials, metal complexes having a quinoline skeleton or a benzoquinoline skeleton, such as tris(8-quinolinolato)aluminum (abbreviation: Alq$_3$), tris(4-methyl-8-quinolinolato)aluminum (abbreviation: Almq), bis(10-hydroxybenzo[h]-quinolinato)beryllium (abbreviation: BeBq$_2$), or bis(2-methyl-8-quinolinolato)(4-phenylphenolato)aluminum(III) (BAlq) can be used. Besides these materials, metal complexes containing an oxazole-based or thiazole-based ligand, such as bis[2-(2-hydroxyphenyl)-benzoxazolato]zinc (abbreviation: Zn(BOX)$_2$) or bis[2-(2-hydroxyphenyl)-benzothiazolato]zinc (abbreviation: Zn(BTZ)$_2$), and the like can also be used. Furthermore, beside the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), bathophenanthroline (abbreviation: BPhen), bathocuproine (abbreviation: BCP), or the like can also be used. Although a substance having an electron mobility of higher than or equal to $10^{-6}$ cm$^{-2}$/Vs is preferably used for the electron-transporting layer, any substance can be used for the electron-transporting layer as long as the electron-transporting property thereof is higher than the hole-transporting property thereof. Moreover, the electron-transporting layer is not limited to a single-layer structure, and may be formed as a multilayer structure in which two or more layers formed of substances which satisfy the above-described conditions are mixed. The electron-transporting layer can be formed by a vacuum evaporation method, or the like.

Further, for the electron-transporting layer, a high molecular compound can also be used. For example, poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. In this case, a solution process such as an ink-jet method or a spin coating method can be used.

Note that for the electron-transporting layer which is in contact with the light-emitting layer, a substance having excitation energy higher than that of the first light-emitting substance which is a light-emitting substance of the third layer 104 is preferably used. Such a structure makes it possible to suppress energy transfer from the light-emitting layer to the electron-transporting layer and realize high emission efficiency.

In the case of using an electron-injecting layer, there is no particular limitation on an electron-injecting material used for forming the electron-injecting layer. Specifically, an alkali metal compound or an alkaline earth metal compound such as calcium fluoride, lithium fluoride, lithium oxide, or lithium chloride, or the like is preferable. Alternatively, a layer in which an electron-transporting material such as tris(8-quinolinolato)aluminum (abbreviation: Alq) or bathocuproine (abbreviation: BCP) is mixed with alkali metal or alkaline earth metal such as lithium or magnesium can also be used. The electron-injecting layer is formed in contact with a cathode, and a carrier injection barrier is reduced by use of the electron-injecting layer, so that carriers are efficiently injected into the light-emitting element, which results in reduction of driving voltage. It is more preferable that the electron-injecting layer be formed using the layer in which a substance having an electron-transporting property is combined with alkali metal or alkaline earth metal, because electron injection from the cathode efficiently proceeds. The electron-injecting layer can be formed by a vacuum evaporation method or the like.

Note that the layer 107 containing an organic compound can be formed by either a wet process or a dry process, such as an evaporation method, an ink-jet method, a spin coating method, or a dip coating method, as well as the above-described formation method.

Moreover, when the electron-injecting layer is provided between the cathode and the electron-transporting layer, any of a variety of conductive materials such as Al, Ag, ITO, and indium oxide-tin oxide containing silicon or silicon oxide can be used regardless of its work function.

After that, a cathode is formed, whereby the light-emitting element is completed. For the cathode, metal, alloy, a conductive compound, a mixture thereof or the like, which has a low work function (specifically lower than or equal to 3.8 eV), is preferably used. As specific examples, any of metals belonging to Group 1 or Group 2 of the periodic table, that is, an alkali metal such as lithium (Li) or cesium (Cs); an alkaline earth metal such as magnesium (Mg), calcium (Ca), or strontium (Sr); an alloy containing them (Mg—Ag, Al—Li, or the like); a rare earth metal such as europium (Eu) or ytterbium (Yb); and an alloy containing them are given. A film of an alkali metal, an alkaline earth metal, or an alloy thereof can be formed by a vacuum evaporation method. A film of an alloy containing an alkali metal or an alkaline earth metal can be formed by a sputtering method. Alternatively, a film of a silver paste or the like can also be formed by an ink-jet method or the like.

Note that a conductive composition containing a conductive high molecule (also referred to as a conductive polymer) can also be used for the anode or the cathode. When a thin film of a conductive composition is formed as an anode or a cathode, the thin film preferably has sheet resistance of lower than or equal to 10000 Ω/square and light transmittance of higher than or equal to 70% at a wavelength of 550 nm. Further, resistivity of a conductive high molecule which is contained in the thin film is preferably lower than or equal to 0.1 Ω·m.

As a conductive high molecule, so-called π electron conjugated conductive high molecule can be used. For example, polyaniline and/or a derivative thereof, polypyrrole and/or a derivative thereof, polythiophene and/or a derivative thereof, and a copolymer of two or more kinds of those materials are given.

Specific examples of a conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid) and the like.

One of the above-described conductive high molecules can be used alone for an anode or a cathode, or an organic resin may be added to such a conductive high molecule in order to adjust film characteristics so that it can be used as a conductive composition.

As for the organic resin, a thermosetting resin, a thermoplastic resin, or a photocurable resin may be used, as long as such a resin is compatible to a conductive high molecule or a resin can be mixed and dispersed into a conductive high molecule. For example, the followings are given: a polyester-based resin such as polyethylene terephthalate, polybutylene terephthalate, or polyethylene naphthalate; a polyimide-based resin such as polyimide or polyamideimide; a polyamide resin such as polyamide 6, polyamide 6,6, polyamide 12, or polyamide 11; a fluorine resin such as polyvinylidene fluoride, polyvinyl fluoride, polytetrafluoroethylene, ethylenetetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of these resins.

Further, the conductive high molecule or the conductive composition described above may be doped with an acceptor dopant or a donor dopant so that oxidation-reduction potential of a conjugated electron in a conjugated conductive high molecule may be changed in order to adjust conductivity of the conductive high molecule or the conductive composition.

As an acceptor dopant, a halogen compound, Lewis acid, proton acid, an organic cyano compound, an organometallic compound, or the like can be used. Examples of a halogen compound include chlorine, bromine, iodine, iodine chloride, iodine bromide, iodine fluoride. As the Lewis acid, phosphorus pentafluoride, arsenic pentafluoride, antimony pentafluoride, boron trifluoride, boron trichloride, boron tribromide, and the like are given. As the proton acid, inorganic acid such as hydrochloric acid, sulfuric acid, nitric acid, phosphoric acid, fluoroboric acid, hydrofluoric acid, or perchloric acid and organic acid such as organic carboxylic acid or organic sulfonic acid can be given. As the organic carboxylic acid and the organic sulfonic acid, any of carboxylic acid compounds and sulfonic acid compounds can be used. As the organic cyano compound, a compound in which two or more cyano groups are included in a conjugated bond can be used. For example, tetracyanoethylene, tetracyanoethylene oxide, tetracyanobenzene, tetracyanoquinodimethane, tetracyano azanaphthalene and the like are given.

As a donor dopant, an alkali metal, an alkaline earth metal, and the like can be given.

Further, a thin film used for the anode or the cathode can be formed by a wet process using a solution in which the above conductive high molecule or the above conductive composition is dissolved in water or an organic solvent (for example, an alcohol-based solvent, a ketone-based solvent, an ester-based solvent, a hydrocarbon-based solvent, or an aromatic-based solvent).

There is no particular limitation on the solvent in which the above conductive high molecule or the above conductive composition is dissolved, as long as the above-described conductive high molecule and the high molecular resin compound such as an organic resin are dissolved. For example, the conductive high molecule or the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methylethylketone, methylisobutylketone, toluene, and/or the like.

After the conductive composition is dissolved in a solvent as described above, a film thereof can be formed by a wet process such as an application method, a coating method, a droplet discharge method (also referred to as an ink-jet method), or a printing method. The solvent may be evaporated with heat treatment or may be dried under reduced pressure. In the case where the organic resin is a thermosetting resin, heat treatment may be further performed. In the case where the organic resin is a photocurable resin, light irradiation treatment may be performed.

Note that by change of types of the first electrode 100 and the second electrode 101, the light-emitting element of this embodiment has variations. When the second electrode 101 has a light-transmitting property, light is emitted from the second electrode 101 side, whereas when the second electrode 101 has a light-shielding property (reflectivity, in particular) and the first electrode 100 has a light-transmitting property, light is emitted from the first electrode 100 side. Furthermore, when both the second electrode 101 and the first electrode 100 have a light-transmitting property, light can be emitted from both the first electrode side and the second electrode side.

[Embodiment 2]

In Embodiment 2, an embodiment of a light-emitting element in which a plurality of light-emitting units are stacked (hereinafter this light-emitting element is referred to as a stacked-type light-emitting element) will be described with reference to FIG. 2. This light-emitting element is a stacked-type light-emitting element having a plurality of light-emitting units between a first electrode 501 and a second electrode 502. Each structure of the light-emitting units can be similar to the structure of the layer 107 containing an organic compound, which is described in Embodiment 1. That is, the light-emitting element described in Embodiment 1 is a light-emitting element including one light-emitting unit. In this embodiment, a light-emitting element including a plurality of light-emitting units is described.

Figure 2:
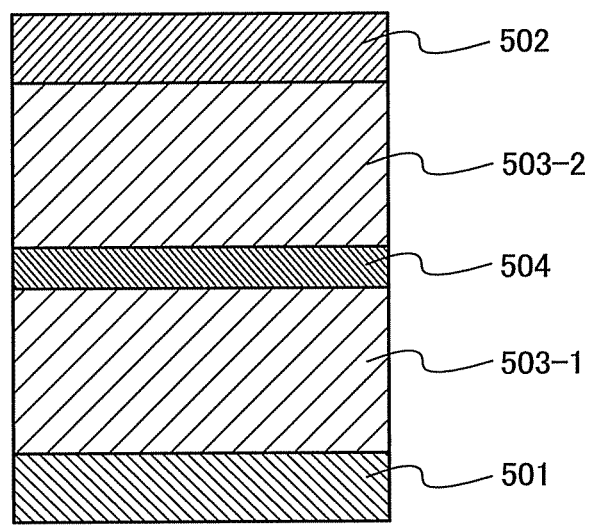
FIG. 2 is a conceptual view of a light-emitting element according to Embodiment 2.

In FIG. 2, a first light-emitting unit 503-1 and a second light-emitting unit 503-2 are stacked between the first electrode 501 and the second electrode 502. As the first electrode 501 and the second electrode 502, electrodes which are similar to those described in Embodiment 1 can be applied. In addition, the first light-emitting unit 503-1 and the second light-emitting unit 503-2 may have either the same structure or different structures, each of which can be similar to that of the layer 107 containing an organic compound which is described in Embodiment 1. Further, when one of the first light-emitting unit 503-1 and the second light-emitting unit 503-2 has a structure similar to that of the layer 107 containing an organic compound described in Embodiment 1, the other may have other known structures.

In addition, this embodiment describes the case where the first electrode 501 functions as an anode and the second electrode 502 functions as a cathode. Any structure of a charge generation layer 504 interposed between the first light-emitting unit 503-1 and the second light-emitting unit 503-2 is acceptable as long as it is one by which electrons are injected into the first light-emitting unit 503-1 and holes are injected into the second light-emitting unit 503-2 when a voltage is applied to the first electrode 501 and the second electrode 502. However, a preferable example of the charge generation layer 504 is a structure in which at least two layers of a layer which can inject electrons and a layer which can inject holes are included and the layer which can inject electrons is in contact with the first light-emitting unit 503-1 and the layer which can inject holes is in contact with the second light-emitting unit 503-2. Alternatively, a structure may be employed in which a layer including a substance with a high electron-transporting property (an electron-relay layer) is interposed between the layer which can inject holes and the layer which can inject electrons.

As the layer which can inject electrons, a layer having a structure which is similar to that of the cathode and the electron-injecting layer which are described in Embodiment 1 can be used. In particular, a composite material in which an alkali metal or an alkaline earth metal is contained in a layer formed of a substance having an electron-transporting property, as described in Embodiment 1, is preferable.

On the other hand, as the layer which can inject holes, a layer having a structure which is similar to that of the anode and the hole-injecting layer which are described in Embodiment 1 can be used. In particular, a composite material in which an acceptor substance is contained in a layer formed of a substance having a hole-transporting property, as described in Embodiment 1, is preferable.

It is preferable that a substance whose LUMO level is higher than or equal to −5.0 eV be used as the substance with a high electron-transporting property which can be used for the electron-relay layer. A perylene derivative, a condensed aromatic compound containing nitrogen, or the like can be preferably used. Specific examples of the perylene derivative include 3,4,9,10-perylenetetracarboxylicdianhydride (abbreviation: PTCDA), N,N'-Diphenylglyoxaline-3,4,9,10-perylenetetracarboxylic acid diacidamide (abbreviation: PTCBI), N,N'-dioctyl-3,4,9,10-perylenetetracarboxylic diimide (abbreviation: PTCDI-C8H) and the like. In addition, specific examples of the condensed aromatic compound containing nitrogen include pyrazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT-(CN)$_6$), 2,3-diphenylpyrid[2,3-b]pyrazine (abbreviation: 2PYPR), 2,3-bis(4-fluorophenyl)pyrido[2,3-b]pyrazine (abbreviation: F2PYPR) and the like. Besides, other examples of the substance which can be used for the electron-relay layer include perfluoropentacene, 7,7,8,8-tetracyanoquinodimethane (abbreviation: TCNQ), 1,4,5,8-naphthalenetetracarboxylic dianhydride (abbreviation: NTCDA), (1,2,3,4,8,9,10,11,15,16,17,18,22,23,24,25-hexadecafluorophthalocyaninato)copper (abbreviation: F16CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophene) (abbreviation: DCMT), methanofullerene such as [6,6]-phenyl C$_{61}$ butyric acid methyl ester (abbreviation: PCBM), or the like.

As a specific example of the charge generation layer 504, a layer having a structure can be given in which a layer in which lithium is added to BPhen which is a substance having an electron-transporting property, and a layer in which molybdenum oxide is added to NPB which is a substance having a hole-transporting property, are stacked in this order from the first electrode 501 side. Alternatively, a layer having a structure in which an electron-relay layer including 3,4,9,10-perylenetetracarboxylic-bis-benzimidazole (abbreviation: PTCBI) is interposed between the above two layers, and the like can be given.

For example, in one of the light-emitting units, when a structure of the layer 107 containing the light-emitting substance described in Embodiment 1 is applied to one of the light-emitting units and a substance emitting blue fluorescence (blue fluorescent light-emitting substance) is used as the first light-emitting substance and a substance emitting green phosphorescence (green phosphorescent light-emitting substance) is used as the second light-emitting substance, triplet energies of the blue fluorescent light-emitting substance, the first organic compound, the second organic compound and the third organic compound are preferably larger than that of the green phosphorescent light-emitting substance. In the case where the triplet energy of the blue fluorescent light-emitting substance, the first organic compound, the second organic compound or the third organic compound is smaller than that of the green phosphorescent light-emitting substance, energy transfer from the green phosphorescent light-emitting substance occurs and efficiency of phosphorescence emission is decreased due to radiationless deactivation of triplet exciton.

Since the triplet excitation energy of the anthracene derivative which is used as the light-emitting substance in one embodiment of the present application is low, it is probable that the efficiency of phosphorescence emission is significantly decreased. Therefore, triplet excitation energy of a material used for the light-emitting layer and a peripheral material thereof is necessary to be considered. Accordingly, materials are limited and a structure of an element becomes complicated.

Therefore, it is preferable that light-emitting units be separated to a unit emitting fluorescence and a unit emitting phosphorescence. Accordingly, without consideration of the complicated energy transfer between a fluorescent light-emitting substance and a phosphorescent light-emitting substance, a light-emitting element can be obtained which provides white light by combining the three primary colors, red, green, and blue by utilizing phosphorescence, which is advantageous in terms of efficiency. Since a light-emitting substance which emits red or green phosphorescence and has favorable characteristics has been developed, it is preferable that the light-emitting unit utilizing phosphorescence provide light which has a long wavelength such as red or green light.

In the case where both the first and the second light-emitting units are units which emit light obtained from two kinds of light-emitting substances, a preferable structure of a light-emitting element which exhibits white light emission is one in which the light-emitting substances in each light-emitting unit are combined so that the colors of the light emitted from the light-emitting substances are complementary to each other, and in addition, in which the combination of the light-emitting substances in the first light-emitting unit is made different from that in the second light-emitting unit. In other words, the preferable structure is one in which both the first and second light-emitting units exhibit white light emission by combining complementary colors of the light with different wavelengths. This is because changes in emission color with accumulation of a driving time can be suppressed.

In this embodiment, the light-emitting element having two light-emitting units is described; however, a light-emitting element in which three or more light-emitting units are stacked can also be manufactured in a similar manner. Arrangement of a plurality of light-emitting units, which are partitioned by a charge generation layer, between a pair of electrodes, in a mariner similar to the light-emitting element of this embodiment, makes it possible to realize a long-life element in a high luminance region, with the current density kept low. Further, when the light-emitting element is applied to a lighting device, voltage drop due to the resistance of the electrode materials can be suppressed; accordingly, uniform light emission in a large area can be achieved. Moreover, a light-emitting device with low power consumption, which can be driven at low voltage, can be achieved.

Note that this embodiment can be combined with any of the other embodiments as appropriate.

[Embodiment 3]

In this embodiment, an example of a light-emitting device manufactured using the light-emitting element described in Embodiment 1 or 2 will be described. Note that the light-emitting device of an embodiment of the present invention is not limited to a light-emitting device having a structure described below, and it includes, in its category, all modes in each of which a display portion (for example, a pixel portion 602 in this embodiment) includes the light-emitting element described in Embodiment 1 or 2.

An example of a light-emitting device manufactured using the light-emitting element described in Embodiment 1 or 2 will be described with reference to FIGS. 3A and 3B. FIG. 3A is a top view of the light-emitting device, and FIG. 3B is a cross-sectional view taken along A-A' and B-B' in FIG. 3A. This light-emitting device includes a driver circuit portion (a source side driver circuit) 601, a pixel portion 602, and a driver circuit portion (a gate side driver circuit) 603 in order to control the light emission of the light-emitting element. In addition, a reference numeral 604 represents a sealing substrate, a reference numeral 605 represents a sealant, and the inside surrounded by the sealant 605 is a space 607. The sealing substrate 604 may be provided with a desiccant 625.

A lead wiring 608 is a wiring for transmitting a signal to be inputted to the source side driver circuit 601 and the gate side driver circuit 603, and this wiring 608 receives a video signal, a clock signal, a start signal, a reset signal, and the like from a flexible printed circuit (FPC) 609 that is an external input terminal. Although only the FPC is illustrated here, the FPC may be provided with a printed wiring board (PWB). The light-emitting device in this specification includes not only the light-emitting device itself but also the light-emitting device to which an FPC or a PWB is attached.

Next, a cross-sectional structure will be explained with reference to FIG. 3B. The driver circuit portion and the pixel portion are formed over an element substrate 610. Here, the source side driver circuit 601 which is the driver circuit portion and one pixel in the pixel portion 602 are shown.

A CMOS circuit in which an n-channel AFT 623 and a p-channel TFT 624 are combined is formed for the source side driver circuit 601. The driver circuit may be formed by various CMOS circuits, PMOS circuits, or NMOS circuits. Although a driver integration type in which a driver circuit is formed over the same substrate is described in this embodiment, it is not necessarily formed over the same substrate and a driver circuit can be formed not over a substrate but outside a substrate.

The pixel portion 602 has a plurality of pixels, each of which includes a switching TFT 611, a current control TFT 612, a first electrode 613 which is electrically connected to a drain of the current control TFT 612, and a light-emitting element including the first electrode 613, a layer 616 containing an organic compound, and a second electrode 617. Note that an insulator 614 is formed so as to cover an end portion of the first electrode 613. In this embodiment, the insulator 614 contains a positive photosensitive acrylic resin film.

In order to obtain favorable coverage, the insulator 614 is formed to have a curved surface with curvature at an upper end portion or a lower end portion thereof. For example, in the case of using a positive photosensitive acrylic as a material for the insulator 614, the insulator 614 is preferably formed so as to have a curved surface with a curvature radius (0.2 μm to 3 μm) only at the upper end portion thereof. Either a negative type which becomes insoluble in an etchant by light irradiation or a positive type which becomes soluble in an etchant by light irradiation can be used as the insulator 614.

The layer 616 containing an organic compound and the second electrode 617 are formed over the first electrode 613, so that the light-emitting element is formed. As a material used for the first electrode 613 which serves as an anode, metal, an alloy, a conductive compound, and a mixture thereof each having a high work function (specifically, higher than or equal to 4.0 eV) is preferably used. Specifically, a single layer of indium tin oxide (ITO), indium tin oxide containing silicon or silicon oxide, indium oxide containing zinc oxide (ZnO), indium oxide containing tungsten oxide and zinc oxide (IWZO), gold (Au), platinum (Pt), nickel (Ni), tungsten (W), chromium (Cr), molybdenum (Mo), iron (Fe), cobalt (Co), copper (Cu), palladium (Pd), or nitride of a metal material (for example, titanium nitride), can be used. Moreover, a stacked-layer structure of a titanium nitride film and a film containing aluminum as its main component; a three-layer structure of a titanium nitride film, a film containing aluminum as its main component, and a titanium nitride film; or the like can be used. When the stacked-layer structure is used, low wiring resistance, favorable ohmic contact, and a function as an anode are achieved.

The layer 616 containing an organic compound has a similar structure to the layer 107 containing an organic compound described in Embodiment 1 or a plurality of light-emitting units described in Embodiment 2. Either low molecular compounds or high molecular compounds (including oligomers and dendrimers) may be employed as the material used for the layer 616 containing an organic compound. Moreover, not only an organic compound but also an inorganic compound can be partially used for the material for forming the layer 616 containing an organic compound. In addition, the layer 616 containing an organic compound is formed by various methods such as an evaporation method using an evaporation mask, an ink-jet method, and a spin coating method.

As a material used for the second electrode 617, which is formed over the layer 616 containing an organic compound and serves as a cathode, a material having a low work function (Al, Mg, Li, Ca, or an alloy or a compound thereof, such as MgAg, MgIn, AlLi, LiF, or $CaF_2$) is preferably used. In the case where light generated in the layer 616 containing an organic compound is transmitted through the second electrode 617, stacked layers of a metal thin film with reduced thickness and a transparent conductive film (ITO, indium oxide containing 2 wt % to 20 wt % of zinc oxide, indium oxide-tin oxide containing silicon or silicon oxide, zinc oxide (ZnO), or the like) are preferably used as the second electrode 617.

Here, the light-emitting element includes the first electrode 613, the layer 616 containing an organic compound, and the second electrode 617. The specific structures and materials of the light-emitting element have been described Embodiment 1 or 2, and the repeated description is omitted. The description in Embodiment 1 or 2 is to be referred to. Note that the first electrode 613, the layer 616 containing an organic compound, and the second electrode 617 in this embodiment correspond to the first electrode 100, the layer 107 containing an organic compound, and the second electrode 101 in Embodiment 1, the first electrode 501, a plurality of light-emitting units, the charge generation layer, and the second electrode 502 in Embodiment 2, respectively.

The element substrate 610 in which TFTs for the driver circuit and the pixel portion as described above and the light-emitting element are formed is attached to the sealing substrate 604 with a sealant 605, so that a light-emitting device can be provided, in which the light-emitting element 106 described in Embodiment 1 is provided in the space 607 surrounded by the element substrate 610, the sealing substrate 604, and the sealant 605. Note that the space 607 is filled with a filler. There are cases where the space 607 may be filled with an inert gas (such as nitrogen or argon), or where the space 607 may be filled with the sealant 605.

Note that an epoxy-based resin is preferably used as the sealant 605. It is preferable that the material allow as little oxygen as possible to penetrate therethrough. As the sealing substrate 604, a plastic substrate formed of FRP (fiberglass-reinforced plastics), PVF (polyvinyl fluoride), polyester, acrylic, or the like can be used besides a glass substrate or a quartz substrate.

As described above, a light-emitting device of an embodiment of the present invention manufactured using the light-emitting element described in Embodiment 1 or 2 can be obtained.

The light-emitting device of an embodiment of the present invention uses the light-emitting element described in Embodiment 1 or 2 and the light-emitting element has high emission efficiency; thus, a light-emitting device which consumes less power can be obtained. Moreover, the light-emitting element easily realizes an emission color which is intended by a designer, and thus a light-emitting device with excellent display quality can be obtained.

Moreover, the light-emitting element described in Embodiment 1 or 2 has a structure which is preferable as a white-light-emitting element; thus, it can be preferably used for lighting.

Figure 4A:
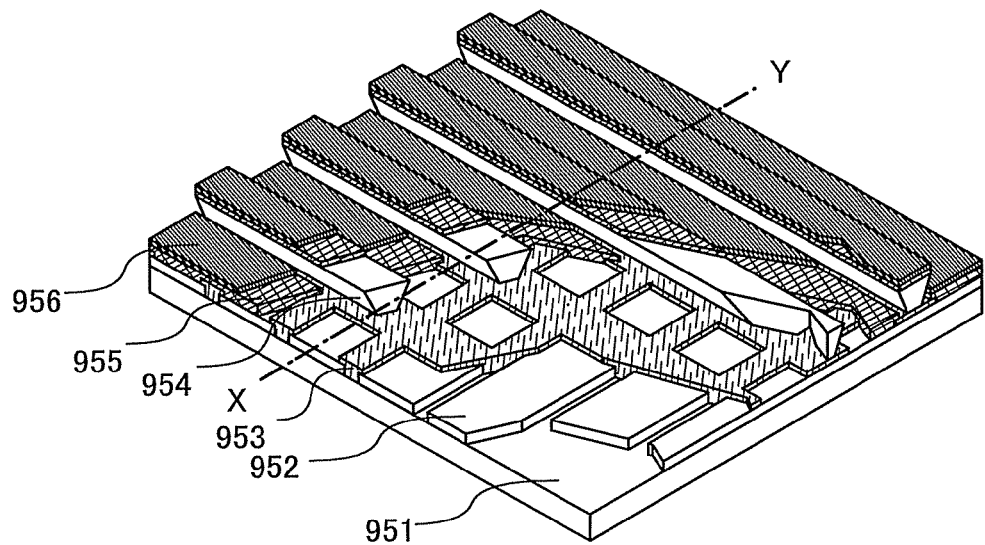
FIGS. 4A and 4B are a perspective view and a cross-sectional view, respectively, of a light-emitting device according to Embodiment 3.
Figure 4B:
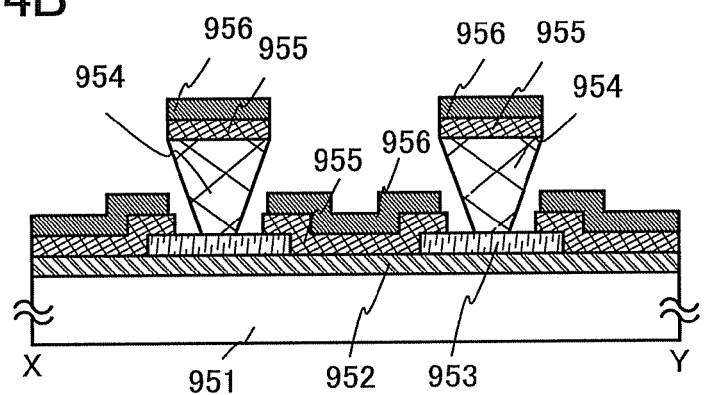

In this embodiment, the active matrix light-emitting device in which the driving of the light-emitting element is controlled by a transistor has been described. However, a passive matrix light-emitting device may be adopted. FIGS. 4A and 4B are views of a passive matrix type light-emitting device manufactured according to one embodiment of the present invention. FIG. 4A is a perspective view of the light-emitting device, and FIG. 4B is a cross-sectional view taken along a line X-Y in FIG. 4A. In FIGS. 4A and 4B, over a substrate 951, a layer 955 containing an organic compound is provided between an electrode 952 and an electrode 956. An end of the electrode 952 is covered with an insulating layer 953. The insulating layer 953 is provided with a partition layer 954 thereover. Sidewalls of the partition layer 954 are slanted so that a distance between one of the sidewalls and the other becomes narrower toward a substrate surface. In other words, a cross section of the partition layer 954 in the direction of a narrow side is trapezoidal, and a base (a side which is in contact with the insulating layer 953) is shorter than an upper side (a side which is not in contact with the insulating layer 953). The partition layer 954 provided in this manner can prevent the light-emitting element from being defective due to static electricity or the like. Also in a passive matrix light-emitting device, the light-emitting element described in Embodiment 1 or 2 is used and the light-emitting element has high emission efficiency; thus, a light-emitting device which consumes less power can be obtained. Moreover, the light-emitting element easily realizes an emission color which is intended by a designer, and thus a light-emitting device with excellent display quality can be obtained.

[Embodiment 4]

In this embodiment, electronic apparatuses which include, as a part thereof, the light-emitting device described in Embodiment 3 will be described. These electronic apparatuses each have a display portion including the light-emitting element described in Embodiment 1 or 2.

As the electronic apparatuses having the light-emitting element described in Embodiment 1 or 2, the followings are given: cameras such as video cameras or digital cameras, goggle type displays, navigation systems, audio reproducing devices (for example, car audio components and audio components), computers, game machines, portable information terminals (for example, mobile computers, cellular phones, portable game machines, and electronic books), and image reproducing devices provided with recording media (specifically, the devices which can reproduce the content of a recording medium such as a digital versatile disc (DVD) and is provided with a display device which is capable of displaying the reproduced images), and the like. Specific examples of these electronic apparatuses are shown in FIGS. 5A to 5D.

Figure 5A:
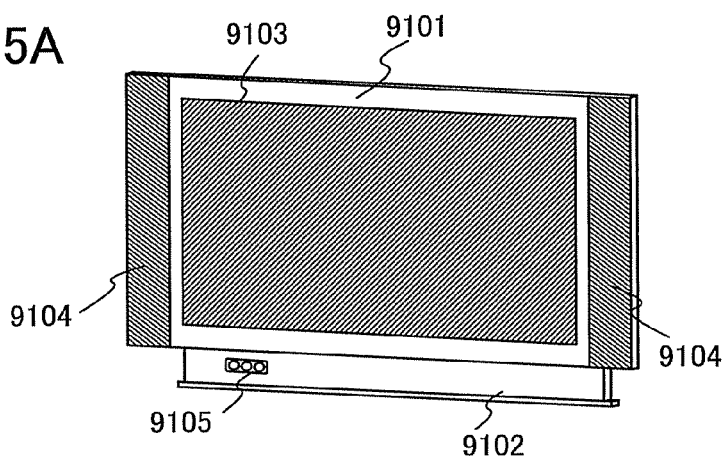
FIGS. 5A to 5D are drawings showing electronic apparatuses according to Embodiment 4.

FIG. 5A shows a television set as one example of one embodiment of the present invention, which includes a housing 9101, a supporting base 9102, a display portion 9103, speaker portions 9104, video input terminals 9105, and the like. In this television set, the display portion 9103 is manufactured using the light-emitting element described in Embodiment 1 or 2 as a display element. Moreover, the power consumption of the display portion 9103 in the television set formed using the light-emitting element with high emission efficiency is reduced, and the television set having the display portion 9103 is a television set which consumes less power.

Figure 5B:
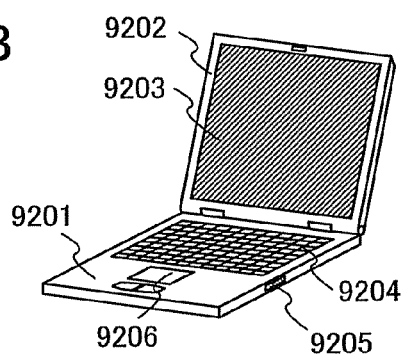

FIG. 5B shows a computer as one example of one embodiment of the present invention, which includes a main body 9201, a housing 9202, a display portion 9203, a keyboard 9204, an external connection port 9205, a pointing device 9206, and the like. In this computer, the display portion 9203 is manufactured using the light-emitting element described in Embodiment 1 or 2 as a display element. Moreover, the power consumption of the display portion 9203 in the computer formed using the light-emitting element with high emission efficiency is reduced, and the computer having the display portion 9203 is a computer which consumes less power.

Figure 5C:
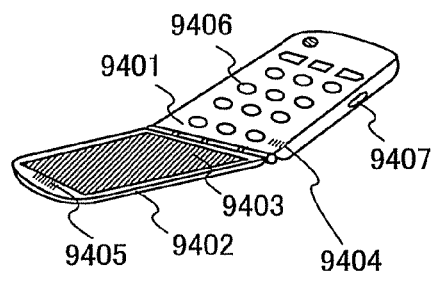

FIG. 5C shows a cellular phone as one example of one embodiment of the present invention, which includes a main body 9401, a housing 9402, a display portion 9403, an audio input portion 9404, an audio output portion 9405, operation keys 9406, an external connecting port 9407, and the like. In this cellular phone, the display portion 9403 is manufactured using the light-emitting element described in Embodiment 1 or 2 as a display element. Moreover, the power consumption of the display portion 9403 in the cellular phone formed using the light-emitting element with high emission efficiency is reduced, and the cellular phone having the display portion 9403 is a cellular phone in which consumes less power.

Figure 5D:
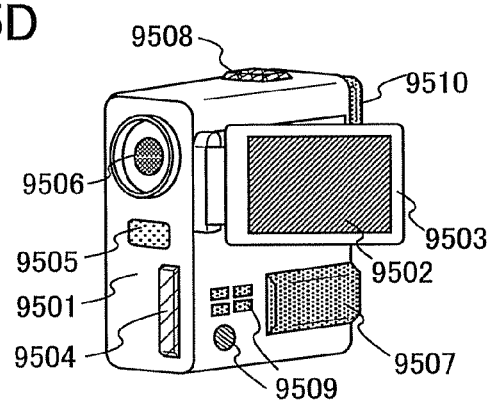

FIG. 5D shows a camera as one example of one embodiment of the present invention, which includes a main body 9501, a display portion 9502, a housing 9503, an external connection port 9504, a remote control receiving portion 9505, an image receiving portion 9506, a battery 9507, an audio input portion 9508, operation keys 9509, an eye piece portion 9510, and the like. In this camera, the display portion 9502 is manufactured using the light-emitting element described in Embodiment 1 as a display element. Moreover, the power consumption of the display portion 9502 in the camera formed using the light-emitting element with high emission efficiency is reduced, and the camera having the display portion 9502 is a camera which consumes less power.

As described above, the application range of the light-emitting apparatus manufactured using the light-emitting element described in Embodiment 1 is extremely wide; thus, the light-emitting device can be applied to electronic apparatuses of various fields. Moreover, a display portion manufactured using the light-emitting element with high emission efficiency is low power consumption, and electronic apparatuses each having the display portion can consume less power.

In addition, the light-emitting device of one embodiment of the present invention can also be used for a lighting device. One mode of application of the light-emitting element described in Embodiment 1 or 2 to a lighting device will be described with reference to FIG. 6.

Figure 6:
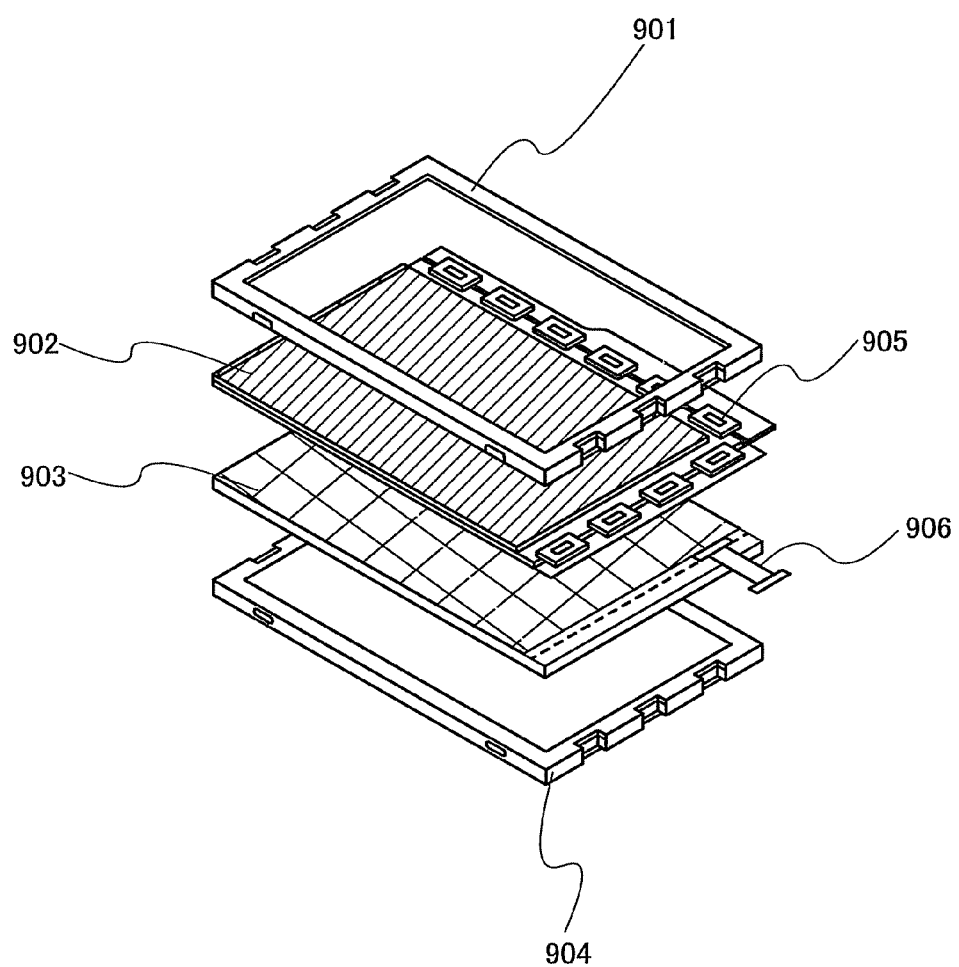
FIG. 6 is a drawing showing an electronic apparatus according to Embodiment 4.

FIG. 6 shows an example of a liquid crystal display device in which the light-emitting element described in Embodiment 1 or 2 is applied as a backlight. The liquid crystal display device shown in FIG. 6 includes a housing 901, a liquid crystal layer 902, a backlight unit 903, and a housing 904. The liquid crystal layer 902 is connected to a driver IC 905. In addition, the backlight unit 903 contains the light-emitting element described in Embodiment 1, and current is supplied thereto through a terminal 906.

It is preferable that the backlight unit 903 of the liquid crystal display device exhibit light of an appropriate color so that the light has a suitable luminance when actually seen through eyes of people who watch the liquid crystal display device after passing through a color filter provided for each pixel. That is, although a film which transmits light of red, blue, or green is normally provided for each pixel as a color filter, transmittance of light is different depending on the material of the color filter and human vision differs depending on the color, and thus the backlight desirably has desired luminance in a wavelength component of each of red, blue, and green. In this regard, color balance of the light-emitting element described in Embodiment 1 or 2 is easily adjusted, and thus the light-emitting element can be used as the backlight unit 903 of the liquid crystal display device very preferably.

Note that either only one or a plurality of the light-emitting elements in Embodiment 1 or 2 may be used for the backlight unit 903.

As described above, the light-emitting element described in Embodiment 1 or 2 can be applied to a backlight of a liquid crystal display device. The area of the backlight can be increased, and thus the area of the liquid crystal display device can be increased. When the backlight is manufactured using the light-emitting element with high emission efficiency, the backlight which consumes less power can be obtained. Furthermore, the backlight is thin and a desired emission color can be easily obtained; thus, reduction in thickness of the liquid crystal display device and improvement in quality of images become possible.

Figure 7:
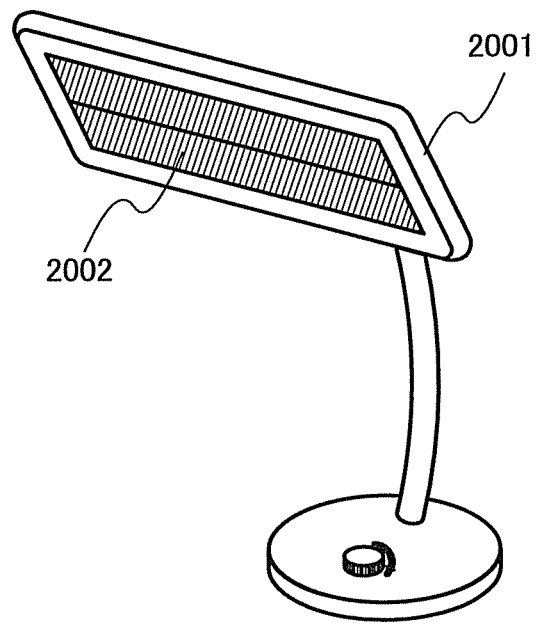
FIG. 7 is a drawing showing an electronic apparatus according to Embodiment 4.

FIG. 7 shows an example in which the light-emitting element described in Embodiment 1 or 2 is used for a desk lamp which is a lighting device. The desk lamp shown in FIG. 7 includes a chassis 2001 and a light source 2002, and the light-emitting element described in Embodiment 1 or 2 is used for the light source 2002. The light source 2002 may be formed from one light-emitting element or a plurality of light-emitting elements described above. Alternatively, the light source 2002 may be formed from plural types of light-emitting elements which exhibit different emission colors. As described above, the light source 2002 can be manufactured using the light-emitting element described in Embodiment 1 or 2. The light source 2002 manufactured using the light-emitting element with high emission efficiency is low power consumption, and thus the desk lamp provided with the light source 2002 can also consume less power. Moreover, since color balance of the light-emitting element described in Embodiment 1 or 2 is easily adjusted, a desk lamp which exhibits emission colors for purposes, for example, eye-friendly emission colors, can be easily provided.

Figure 8:
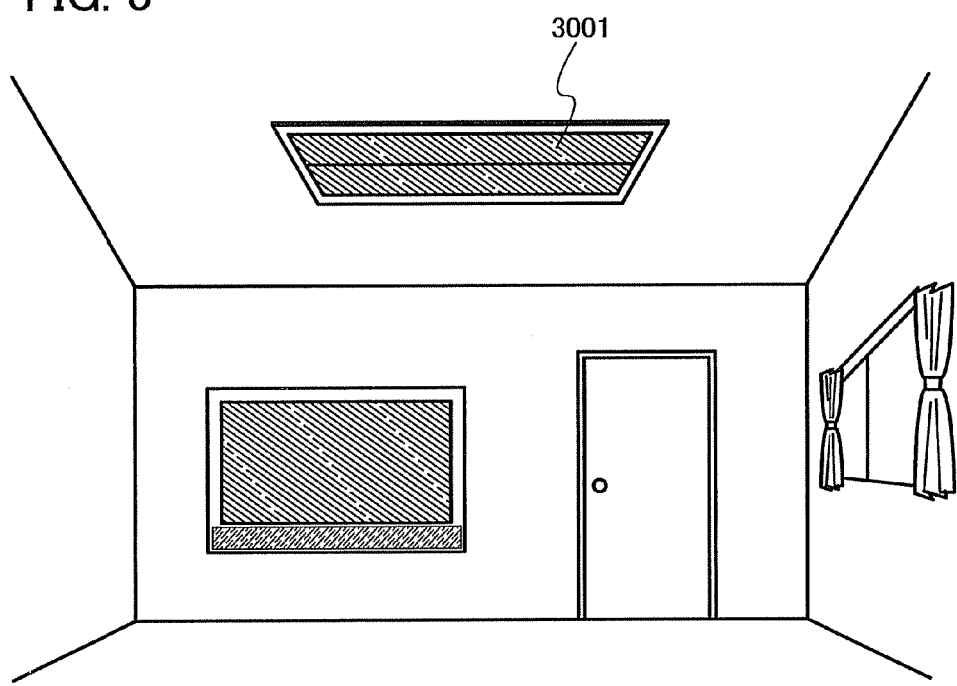
FIG. 8 is a drawing showing an electronic apparatus according to Embodiment 4.

FIG. 8 shows an example in which the light-emitting element described in Embodiment 1 or 2 is used for an indoor lighting device 3001. The lighting device 3001 may be formed from one light-emitting element or a plurality of light-emitting elements described above. Alternatively, the lighting device 3001 may be formed from plural types of light-emitting elements which exhibit different emission colors. As described above, the lighting device 3001 can be manufactured using the light-emitting element described in Embodiment 1 or 2. The area of the lighting device 3001 formed using the light-emitting element can be increased, and thus it can be used as a large area lighting device. Further, the lighting device 3001 manufactured using the light-emitting element having favorable emission efficiency can be a lighting device which is thin and consumes less power. Furthermore, since color balance of the light-emitting element described in Embodiment 1 or 2 is easily adjusted, various emission colors from warm colors to cold colors can be easily provided. Accordingly, lighting devices which exhibit emission colors for purposes can be easily provided. For example, a lighting device exhibiting a warm color can be provided for a living room and a lighting device exhibiting colors with a good color rendering property can be provided for a kitchen or a dining room.

EXAMPLE 1

In this example, a manufacturing method and element characteristics of the light-emitting element described in Embodiment 1 will be described. Note that structural formulas of substances used in this example are shown below.
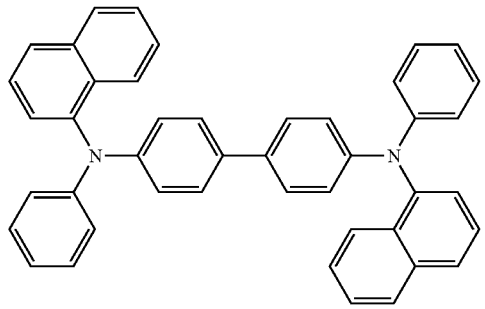
NPB
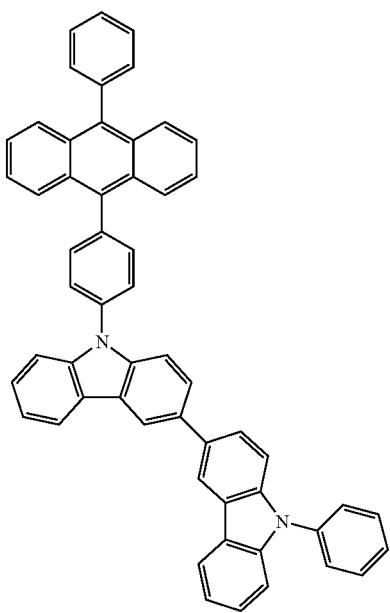
PCCPA
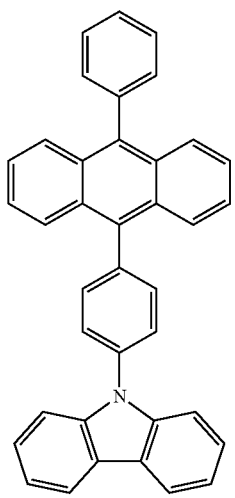
CzPA
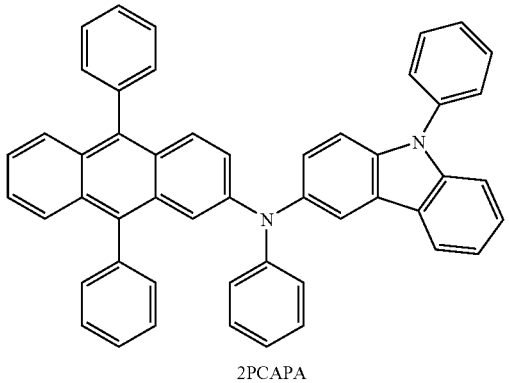
2PCAPA
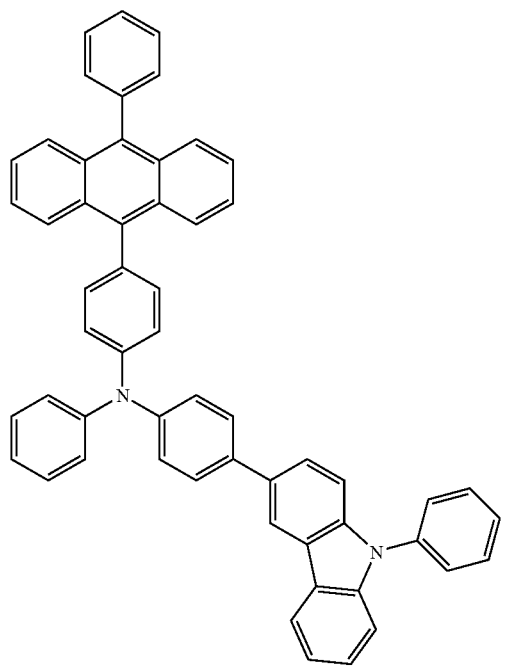
PCBAPA
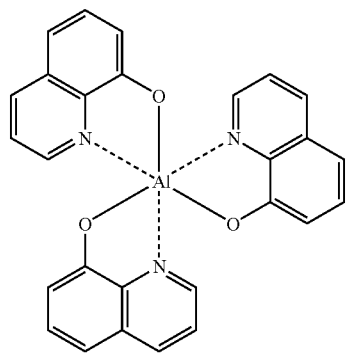
Alq

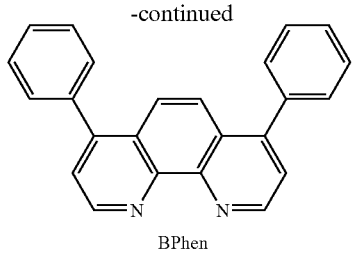
BPhen (Light-Emitting Element 1)

First, indium tin oxide containing silicon or silicon oxide was deposited to a thickness of 110 nm over a glass substrate by a sputtering method. The periphery of a surface of the film was covered with a polyimide film so that an area of 2 mm×2 mm of the surface was exposed. Thus, a first electrode was formed and the electrode area was 2 mm×2 mm.

As pretreatment for forming the light-emitting element on the substrate, the surface of the substrate was washed with water and baked at 200° C. for 1 hour and then, UV ozone treatment was performed for 370 seconds. Then, the substrate was transferred into a vacuum evaporation apparatus whose pressure was reduced to approximately $10^{-4}$ Pa, and vacuum baking at 170° C. for 30 minutes was performed in a heating chamber of the vacuum evaporation apparatus. After that, the substrate was cooled down for approximately 30 minutes.

Next, the substrate over which the first electrode was formed was fixed to a substrate holder provided in the vacuum evaporation apparatus such that the side on which the first electrode was formed faced downward, and the pressure was reduced to about $10^{-4}$ Pa, and then 4,4'-bis[N-(1-naphthyl)-N-phenylamino]biphenyl (abbreviation: NPB) and molybdenum(VI) oxide were co-evaporated, whereby a layer containing a composite material in which an organic compound and an inorganic compound were combined was formed. The thickness of the layer was 50 nm and the weight ratio of NPB to molybdenum(VI) oxide was adjusted to be 4:1 (=NPB: molybdenum oxide). Note that the co-evaporation method is an evaporation method in which evaporation is carried out from a plurality of evaporation sources at the same time in one treatment chamber.

Subsequently, NPB was deposited to a thickness of 10 nm by an evaporation method using resistance heating to form a hole-transporting layer.

After that, 9-[4-(10-phenyl-9-anthryl)phenyl]-9H-carbazole (abbreviation: CzPA) and 4-(10-phenyl-9-anthryl)-4'-(9-phenyl-9H-carbazol-3-yl)triphenylamine (abbreviation: PCBAPA) were co-evaporated to form a first layer with a thickness of 10 nm. Here, the weight ratio of CzPA to PCBAPA was adjusted to be 1:4 (=CzPA:PCBAPA).

Then, 9-phenyl-9'-[4-(10-phenyl-9-anthryl)phenyl]-3,3'-bi(9H-carbazole) (abbreviation: PCCPA) and N,9-diphenyl-N-(9,10-diphenyl-2-anthryl)-9H-carbazol-3-amine (abbreviation: 2PCAPA) were co-evaporated to form a second layer with a thickness of 10 nm. Here, the weight ratio of PCCPA to 2PCAPA was adjusted to be 1:0.005 (=PCCPA:2PCAPA).

Furthermore, CzPA and PCBAPA were co-evaporated to form a third layer with a thickness of 20 nm. Here, the weight ratio of CzPA to PCBAPA was adjusted to be 1:0.05 (=CzPA:PCBAPA).

After that, by an evaporation method using resistance heating, tris(8-quinolinolato)aluminum (abbreviation: Alq) was deposited to a thickness of 10 nm, and then bathophenanthroline (abbreviation: BPhen) was deposited to a thickness of 20 nm to form an electron-transporting layer.

Then, in a similar manner, by an evaporation method using resistance heating, lithium fluoride (LiF) was deposited to a thickness of about 1 nm to form an electron-injecting layer. Finally, aluminum was deposited to a thickness of 200 nm to form a second electrode. Accordingly, a light-emitting element 1 was manufactured.

The light-emitting element 1 obtained through the above-described steps was sealed under a nitrogen atmosphere inside a glove box without being exposed to atmospheric air. Then, the operation characteristics of the light-emitting element 1 were measured. The measurement was carried out at room temperature (in an atmosphere kept at 25° C.).

Figure 9:
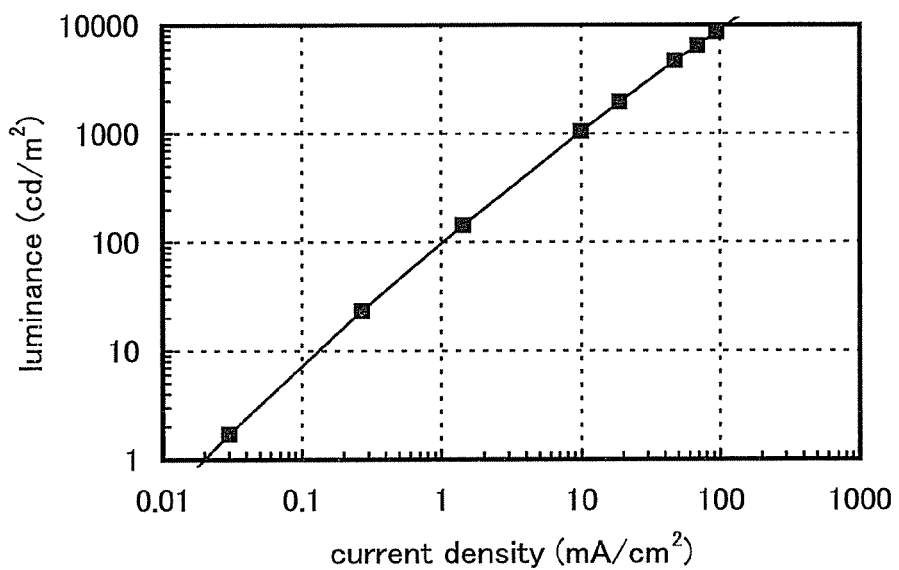
FIG. 9 is a graph showing current density-luminance characteristics of a light-emitting element 1 according to Example 1.
Figure 10:
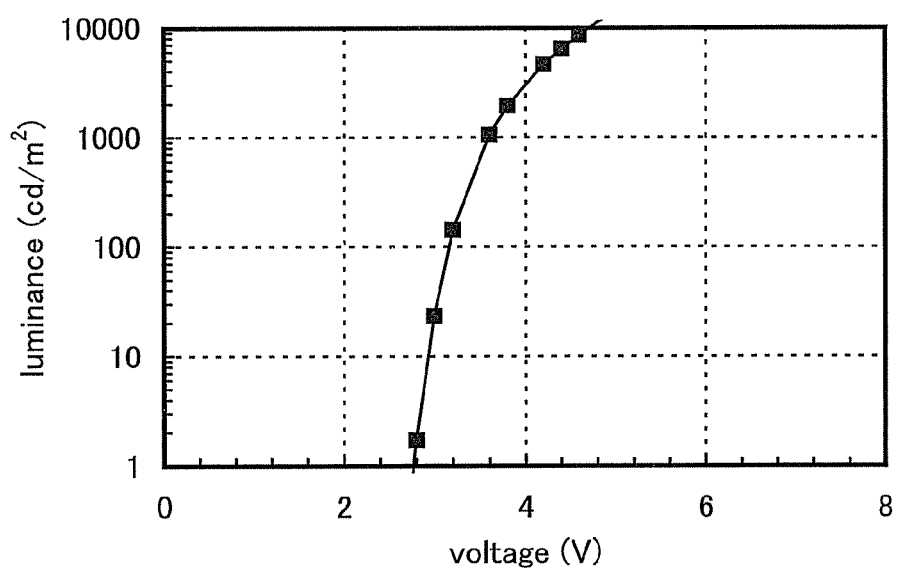
FIG. 10 is a graph showing voltage-luminance characteristics of the light-emitting element 1 according to Example 1.
Figure 11:
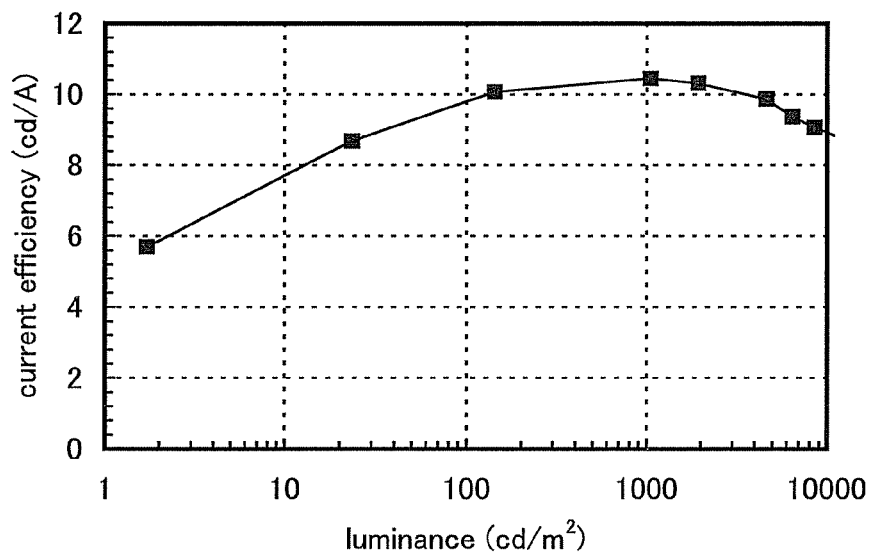
FIG. 11 is a graph showing luminance-current efficiency characteristics of the light-emitting element 1 according to Example 1.

FIG. 9 shows current density-luminance characteristics of the light-emitting element 1; FIG. 10, voltage-luminance characteristics of the light-emitting element 1; FIG. 11, luminance-current efficiency characteristics of the light-emitting element 1; and FIG. 12, luminance-external quantum efficiency characteristics of the light-emitting element 1. Further, FIG. 13 shows an emission spectrum when a current of 1 mA flows to the light-emitting element 1.

Figure 12:
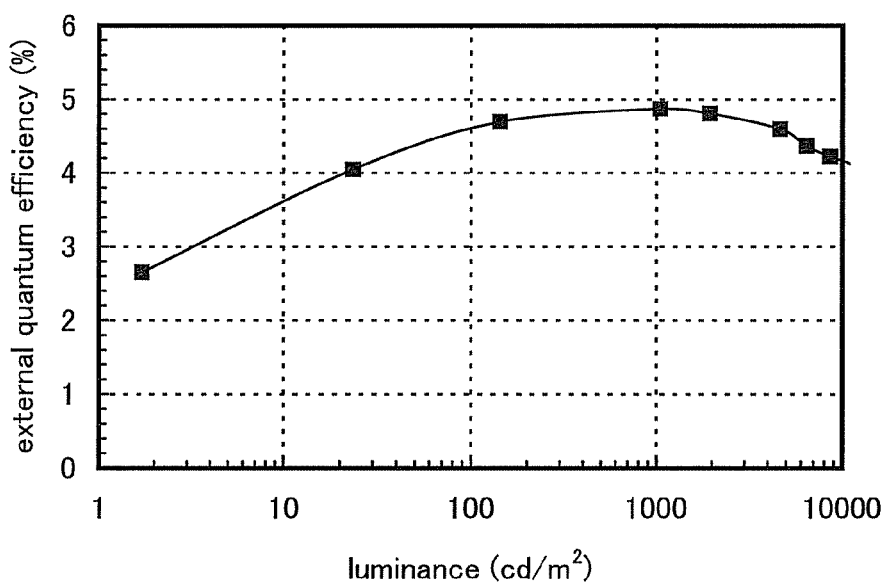
FIG. 12 is a graph showing luminance-external quantum efficiency characteristics of the light-emitting element 1 according to Example 1.
Figure 13:
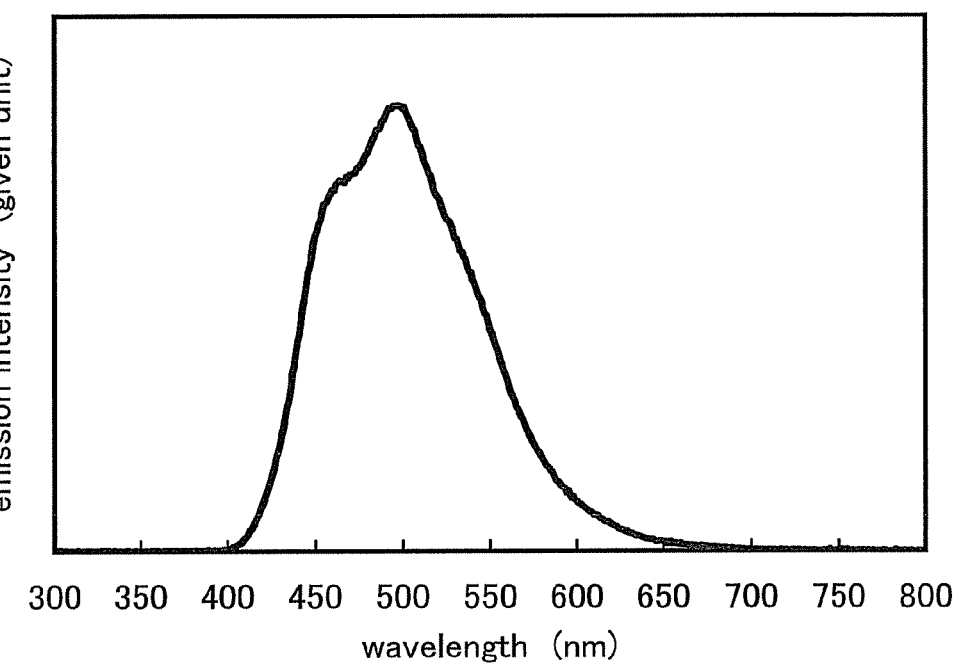
FIG. 13 is a graph showing an emission spectrum of the light-emitting element 1 according to Example 1.

While PCBAPA and 2PCAPA which were used in the light-emitting element 1 are both light-emitting substances exhibiting fluorescence, as shown in FIG. 11 and FIG. 12, the current efficiency and external quantum efficiency of the light-emitting element 1 at a luminance of around 1000 cd/m² were 10.4 cd/A and 4.9%, respectively; thus, it can be seen that the light-emitting element 1, which has the structure described in Embodiment 1, is a light-emitting element which can emit light with extremely high emission efficiency.

PCBAPA, which is the light-emitting substance of the first layer and the third layer, emits blue light and 2PCAPA, which is the light-emitting substance of the second layer, emits green light. That is, according to FIG. 13, it is found that light having a peak near 470 nm is emitted from PCBAPA; light having a peak near 506 nm is emitted from 2PCAPA; and as for the light-emitting element 1, the intensity of the light emitted from PCBAPA with the shorter wavelength is about 80% of the intensity of the light emitted from 2PCAPA with the longer wavelength. In a conventional structure, emission of light with a longer wavelength is enhanced due to influence of energy transfer and it is difficult to balance emission colors. However, with use of the structure of one embodiment of the present invention, like the light-emitting element 1 described above, the emission intensity of light with the shorter wavelength and the emission intensity of light with the longer wavelength can be made substantially equal, and it becomes possible to easily adjust balance of emission colors.

Thus, it can be seen that the light-emitting element 1 is a light-emitting element capable of exhibiting high emission efficiency and in which balance of emission colors can be easily adjusted.

(Light-Emitting Element 2)

A manufacturing method and operation characteristics of a light-emitting element 2 in which materials to form a first layer and a ratio thereof are different from those of the light-emitting element 1 will be described. The light-emitting element 2 was manufactured in a similar manner to the light-emitting element 1 except that a co-evaporated film of PCBAPA and 2PCAPA was formed as the first layer and that the weight ratio of PCBAPA to 2PCAPA was 1:0.02 (=PCBAPA:2PCAPA).

The light-emitting element 2 obtained through the above-described steps was sealed under a nitrogen atmosphere inside a glove box without being exposed to atmospheric air. Then, the operation characteristics of the light-emitting element 2 were measured. The measurement was carried out at room temperature (in an atmosphere kept at 25° C.).

Figure 14:
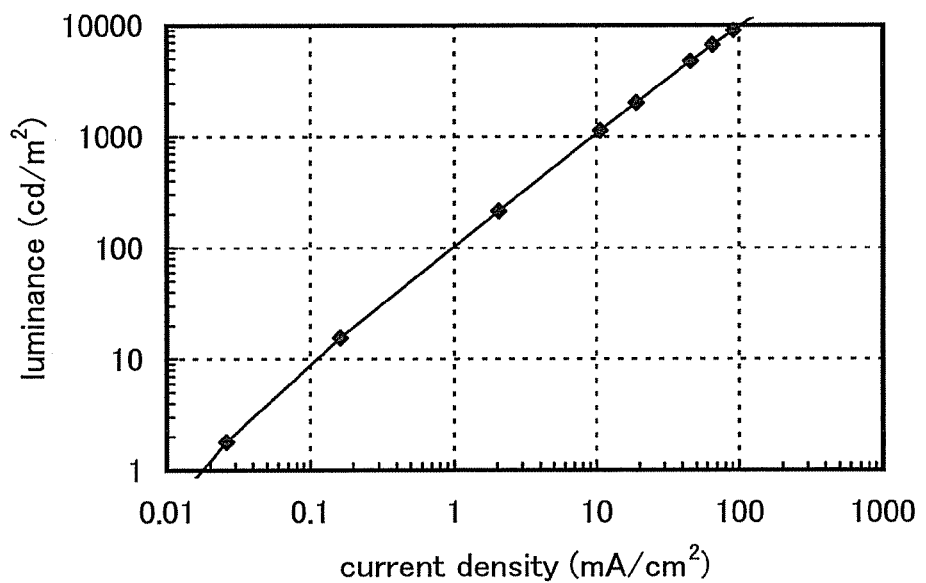
FIG. 14 is a graph showing current density-luminance characteristics of a light-emitting element 2 according to Example 1.
Figure 15:
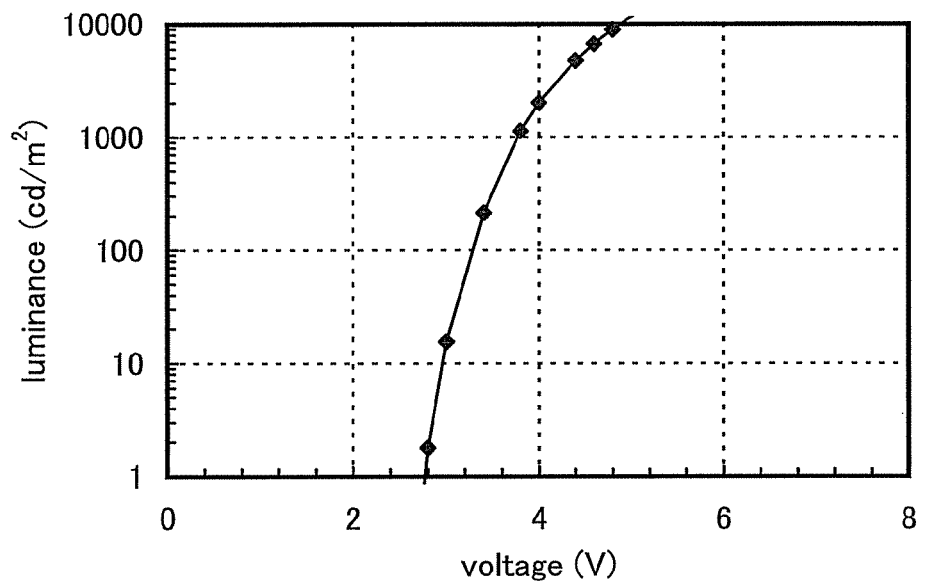
FIG. 15 is a graph showing voltage-luminance characteristics of the light-emitting element 2 according to Example 1.
Figure 16:
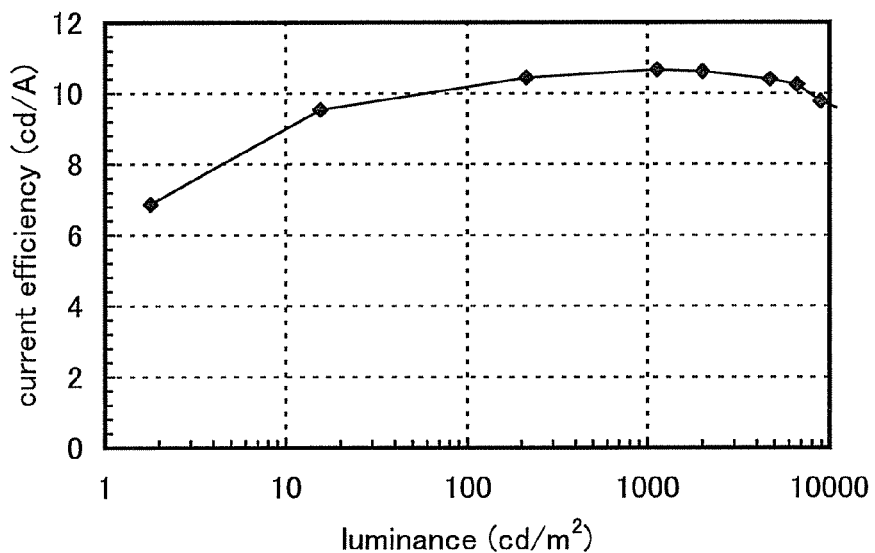
FIG. 16 is a graph showing luminance-current efficiency characteristics of the light-emitting element 2 according to Example 1.
Figure 17:
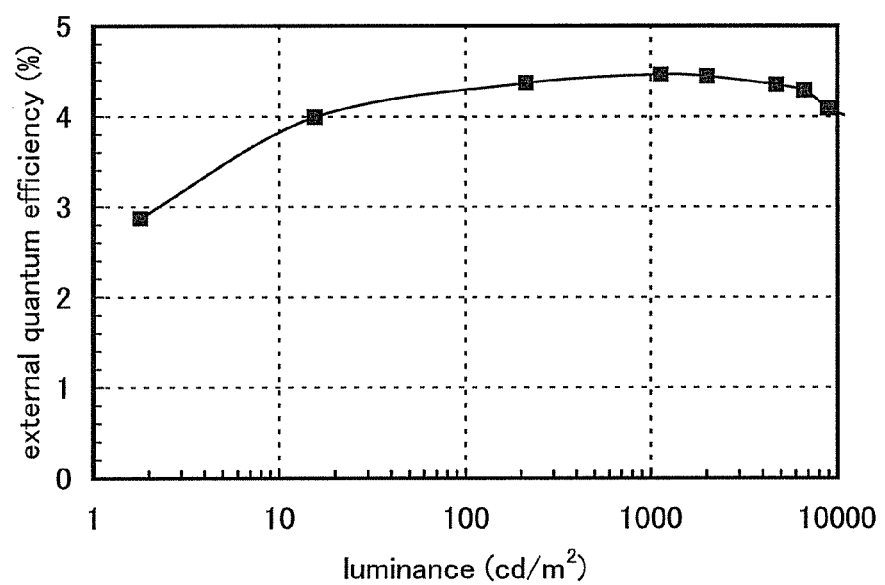
FIG. 17 is a graph showing luminance-external quantum efficiency characteristics of the light-emitting element 2 according to Example 1.
Figure 18:
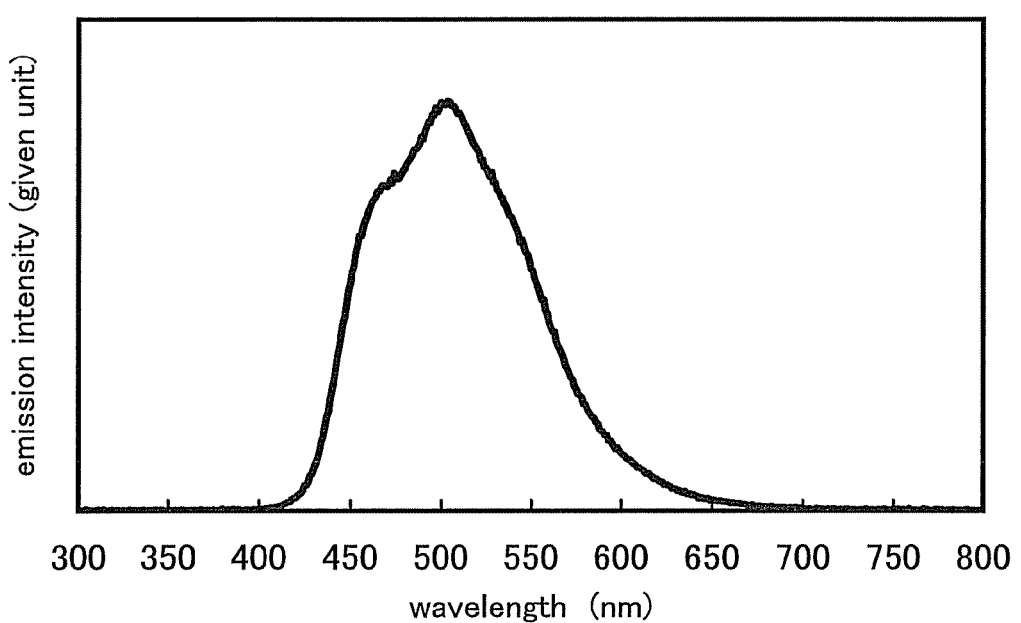
FIG. 18 is a graph showing an emission spectrum of the light-emitting element 2 according to Example 1.

FIG. 14 shows current density-luminance characteristics of the light-emitting element 2. FIG. 15 shows voltage-luminance characteristics of the light-emitting element 2. FIG. 16 shows luminance-current efficiency characteristics of the light-emitting element 2. FIG. 17 shows luminance-external quantum efficiency characteristics of the light-emitting element 2. FIG. 18 shows an emission spectrum when a current of 1 mA flows to the light-emitting element 2.

While PCBAPA and 2PCAPA which were used in the light-emitting element 2 are both light-emitting substances exhibiting fluorescence, as shown in FIG. 16 and FIG. 17, the current efficiency and external quantum efficiency of the light-emitting element 2 at a luminance of around 1000 cd/m$^2$ were 10.7 cd/A and 4.5%, respectively; thus, it can be seen that the light-emitting element 2, which has a structure described in Embodiment 1, is a light-emitting element which can emit light with extremely high emission efficiency.

PCBAPA, which is a light-emitting substance of the first layer and the third layer, emits blue light and 2PCAPA, which is a light-emitting substance of the second layer, emits green light. That is, according to FIG. 18, it is found that light having a peak near 470 nm is emitted from PCBAPA; light having a peak near 506 nm is emitted from 2PCAPA; and as for the light-emitting element 2, the intensity of the light emitted from PCBAPA with the shorter wavelength is about 80% of the intensity of the light emitted from 2PCAPA with the longer wavelength. In a conventional structure, emission of light with a longer wavelength is enhanced due to influence of energy transfer and it is difficult to balance emission colors. However, with use of the structure of one embodiment of the present invention, like the light-emitting element 2 described above, the emission intensity of the light with the shorter wavelength and the emission intensity of the light with the longer wavelength can be made substantially equal, and it becomes possible to easily adjust balance of emission colors.

Thus, it can be seen that the light-emitting element 2 is a light-emitting element capable of exhibiting high emission efficiency and in which balance of emission colors can be easily adjusted.

(Light-Emitting Element 3)

A manufacturing method and operation characteristics of a light-emitting element 3, which has a different structure from that of the light-emitting element 1 or the light-emitting element 2, will be described.

To manufacture the light-emitting element 3, the process up to the step of forming a hole-transporting layer was performed in a manner similar to the light-emitting element 1 and the light-emitting element 2.

Subsequently, PCBAPA was deposited to a thickness of 30 nm to form a first layer.

Then, PCCPA and 2PCAPA were co-evaporated to form a second layer with a thickness of 10 nm. Here, the weight ratio of PCCPA to 2PCAPA was adjusted to be 1:0.02 (=PCCPA: 2PCAPA).

Furthermore, CzPA and PCBAPA were co-evaporated to form a first layer with a thickness of 30 mm. Here, the weight ratio of CzPA to PCBAPA was adjusted to be 1:0.1 (=CzPA: PCBAPA).

Then, in a similar manner to the light-emitting element 1 and the light-emitting element 2, an electron-transporting layer, an electron-injecting layer, and a cathode were formed. Accordingly, the light-emitting element 3 was manufactured.

The light-emitting element 3 obtained through the above-described steps was sealed under a nitrogen atmosphere inside a glove box without being exposed to atmospheric air. Then, the operation characteristics of the light-emitting element 3 were measured. The measurement was carried out at room temperature (in an atmosphere kept at 25° C.).

Figure 19:
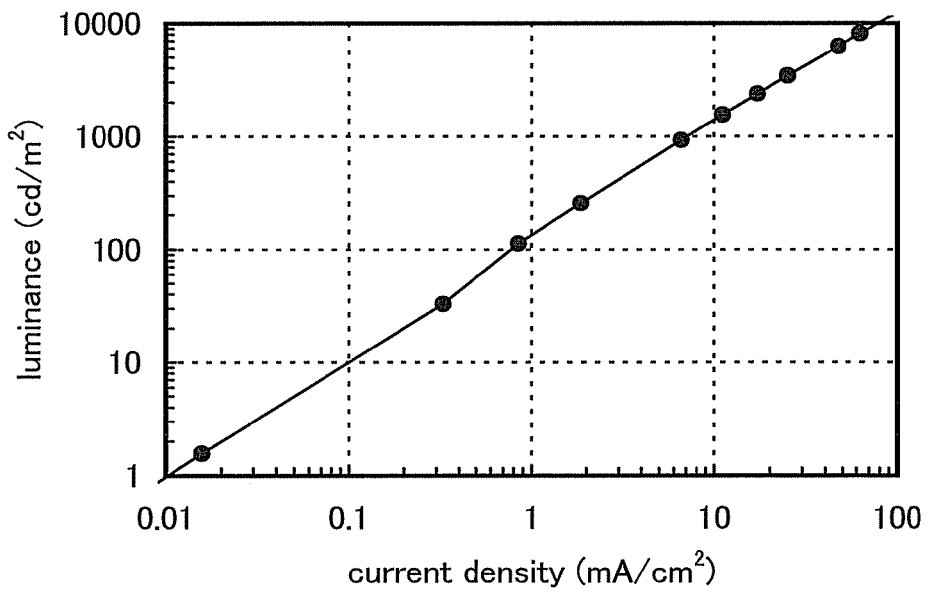
FIG. 19 is a graph showing current density-luminance characteristics of a light-emitting element 3 according to Example 1.
Figure 20:
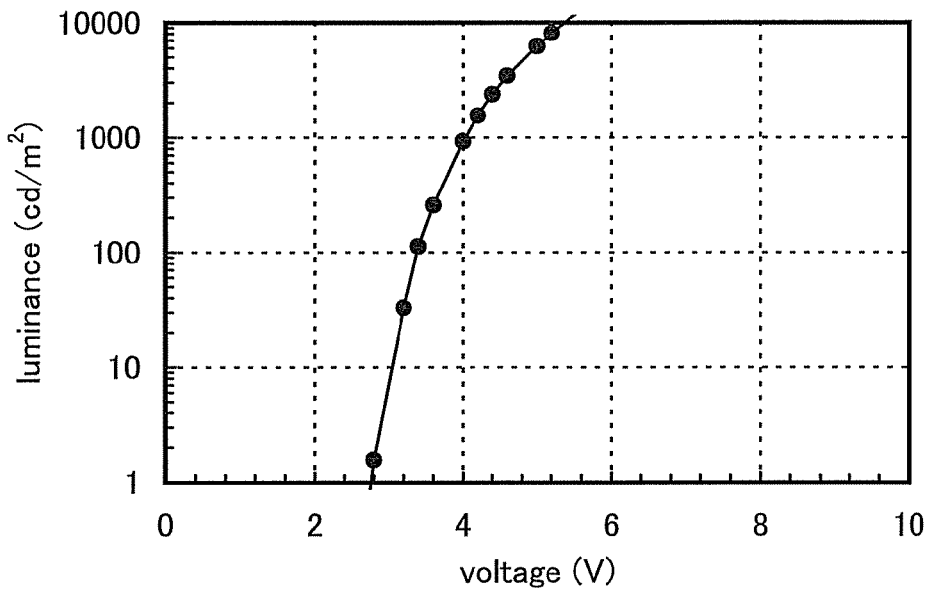
FIG. 20 is a graph showing voltage-luminance characteristics of the light-emitting element 3 according to Example 1.
Figure 21:
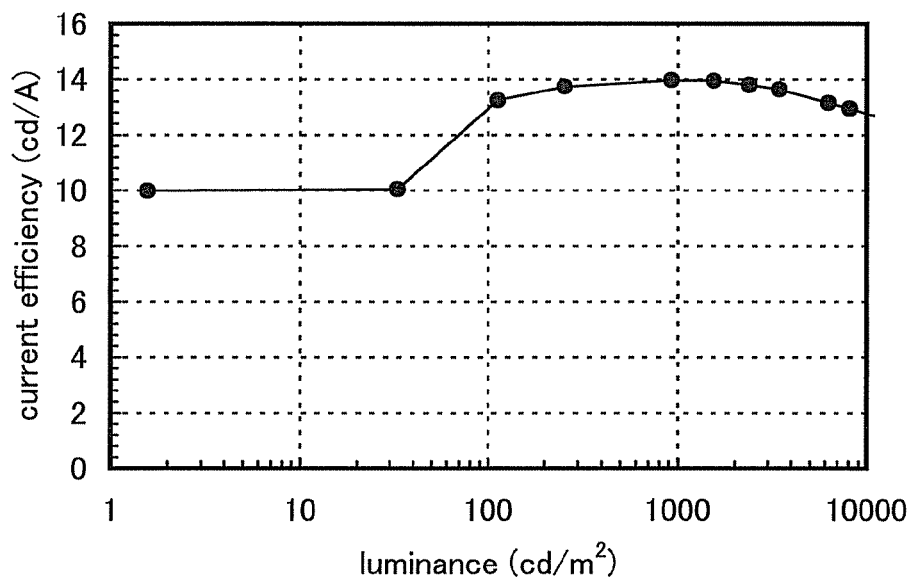
FIG. 21 is a graph showing luminance-current efficiency characteristics of the light-emitting element 3 according to Example 1.
Figure 22:
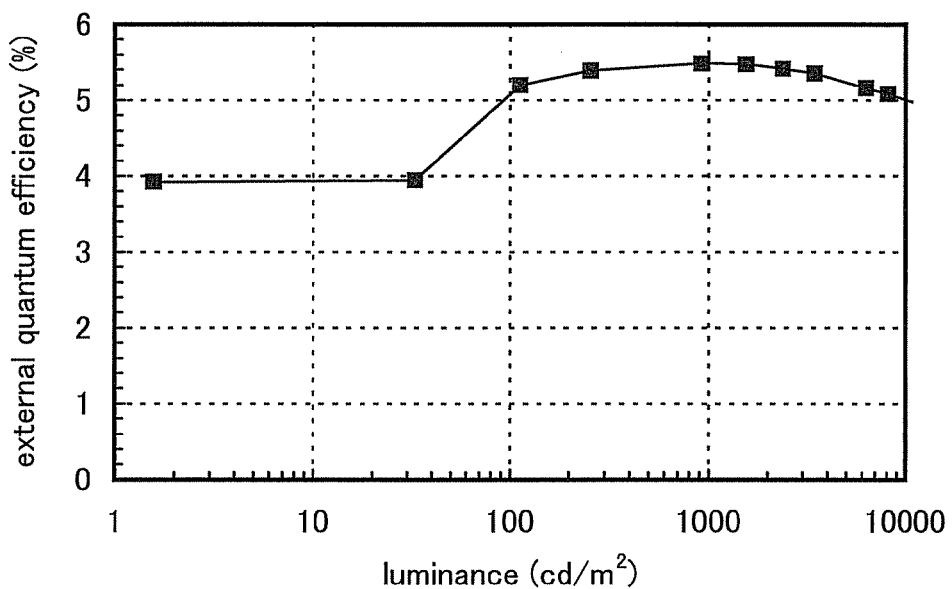
FIG. 22 is a graph showing luminance-external quantum efficiency characteristics of the light-emitting element 3 according to Example 1.
Figure 23:
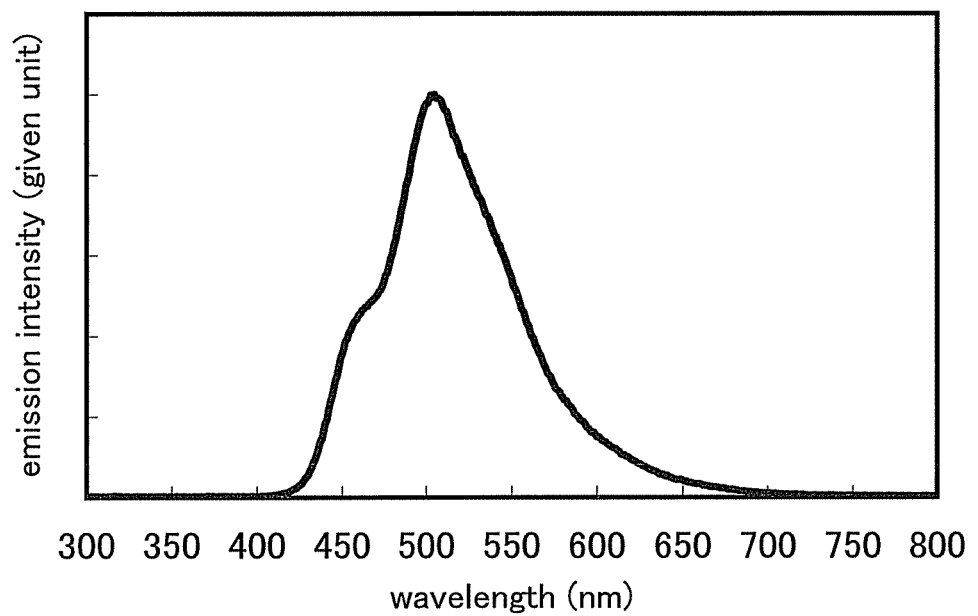
FIG. 23 is a graph showing an emission spectrum of the light-emitting element 3 according to Example 1.

FIG. 19 shows current density-luminance characteristics of the light-emitting element 3. FIG. 20 shows voltage-luminance characteristics of the light-emitting element 3. FIG. 21 shows luminance-current efficiency characteristics of the light-emitting element 3. FIG. 22 shows luminance-external quantum efficiency characteristics of the light-emitting element 3. FIG. 23 shows an emission spectrum when a current of 1 mA flows to the light-emitting element 3.

While PCBAPA and 2PCAPA which were used in the light-emitting element 3 are both light-emitting substances exhibiting fluorescence, as shown in FIG. 21 and FIG. 22, the current efficiency and external quantum efficiency of the light-emitting element 3 at a luminance of around 1000 cd/m$^2$ were 14.0 cd/A and 5.5%, respectively; thus, it can be seen that the light-emitting element 3, which has a structure described in Embodiment 1, is a light-emitting element which can emit light with extremely high emission efficiency.

PCBAPA, which is a light-emitting substance of the first layer and the third layer, emits blue light and 2PCAPA, which is a light-emitting substance of the second layer, emits yellow light. That is, according to FIG. 23, it is found that light having a peak near 470 nm is emitted from PCBAPA; light having a peak near 506 nm is emitted from 2PCAPA; and as for the light-emitting element 3, the intensity of the light emitted from PCBAPA with the shorter wavelength is about 50% of the intensity of the light emitted from 2PCAPA with the longer wavelength. In a conventional structure, emission of light with a longer wavelength is enhanced due to influence of energy transfer and it is difficult to balance emission colors. However, with use of the structure of one embodiment of the present invention, like the light-emitting element 3 described above, the emission intensity of the light with the shorter wavelength and the emission intensity of the light with the longer wavelength can be made substantially equal, and it becomes possible to easily adjust balance of emission colors.

Figure 24:
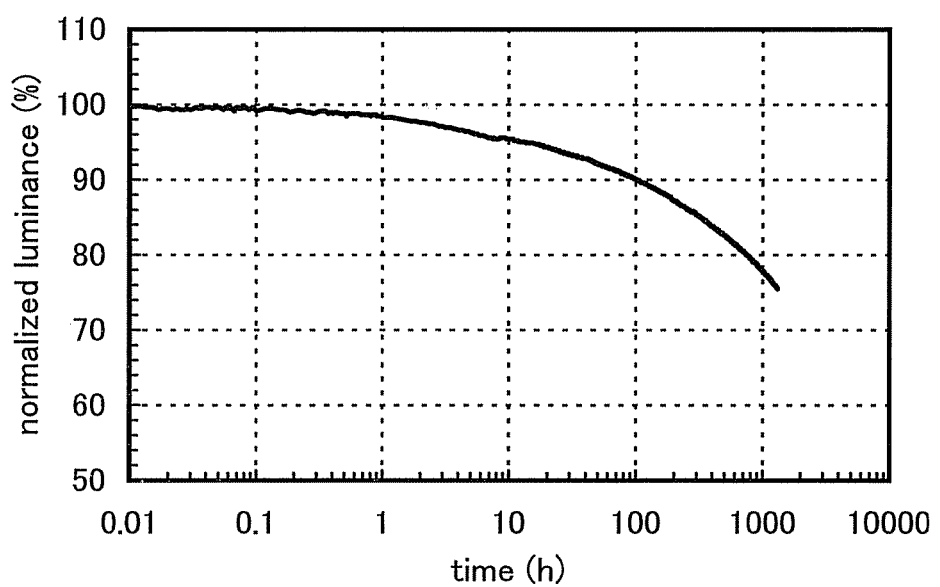
FIG. 24 is a graph showing time dependence of normalized luminance of the light-emitting element 3 according to Example 1.

Next, evaluation results of the reliability are shown. FIG. 24 shows time dependence of normalized luminance of the light-emitting element 3 when the light-emitting element 3 was driven at an initial luminance of 1000 cd/m$^2$ and constant current density. It is understood from FIG. 24 that the luminance half-life period of the light-emitting element 3 is estimated as about 7000 to 8000 hours, and the light-emitting element 3, which has the structure described in Embodiment 1, has a long lifetime.

Note that, although this example specifically describes a light-emitting element in which a light-emitting substance exhibiting blue light emission and a light-emitting substance exhibiting green light emission are used, it is needless to say that a combination of light-emitting substances which emit light of other colors can be employed in one embodiment of the present invention. For example, a white light-emitting element can be obtained by a combination of the light-emitting substances which emit light of colors complementary to each other. As a light-emitting element like this, for example, a light-emitting element in which a blue-light emitting substance and a yellow-light emitting substance are used, a light-emitting element in which a blue-green-light emitting substance and a red-light emitting substance are used, or the like can be given. In addition, a light-emitting element which exhibits white light emission obtained by combining red light, green light, and blue light can be provided when a first light-emitting unit and a second light-emitting unit are stacked with an intermediate layer interposed therebetween, where the first light-emitting unit includes the light-emitting layer in which the light-emitting substance which emits light of blue is combined with the light-emitting substance which emits light of green, both of which are described in this example, and where the second light-emitting unit includes the light-emitting layer which exhibits red light emission. These light-emitting elements can have high emission efficiency because they are each provided with a light-emitting layer having a structure described in Embodiment 1. In addition, color balance of the light-emitting elements is easily adjusted.

COMPARATIVE EXAMPLE

Since PCBAPA used in Example 1 is not a known substance, a synthesis method thereof will be described. PCBAPA is a substance having a structure represented by the structural formula (3).

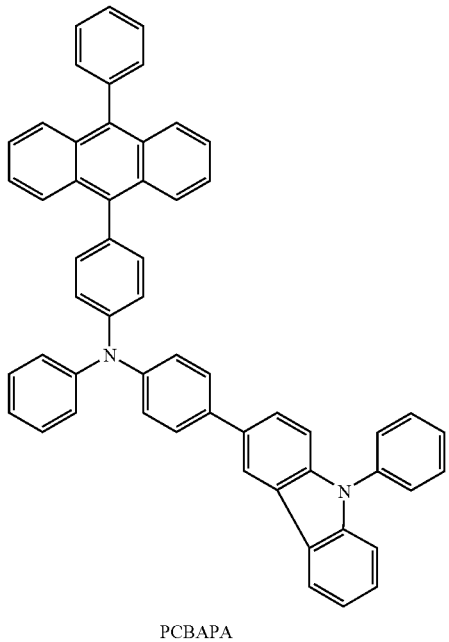

PCBAPA

Step 1: Synthesis of
9-phenyl-9H-carbazole-3-boronic acid

Into a 500 mL three-neck flask was put 10 g (31 mmol) of 3-bromo-9-phenyl-9H-carbazole. The atmosphere in the flask was substituted by nitrogen. Into the flask was put 150 mL of tetrahydrofuran (THF), and 3-bromo-9-phenyl-9H-carbazole was dissolved therein. This solution was cooled to −80° C. Into this solution were dripped 20 mL (32 mmol) of n-butyllithium (a 1.58 mol/L hexane solution) with the use of a syringe. After the dripping was completed, this solution was stirred at the same temperature for 1 hour. After the stirring, 3.8 mL (34 mmol) of trimethyl borate was added to the solution, and the solution was stirred for about 15 hours while the temperature of the solution was being brought back to room temperature. After that, about 150 mL (1.0 mol/L) of dilute hydrochloric acid were added to the solution, and then the solution was stirred for 1 hour. After the stirring, an aqueous layer of the mixture was extracted with ethyl acetate. The extract was combined with an organic layer and then washed with a saturated sodium hydrogen carbonate solution. The organic layer was dried with magnesium sulfate. After the drying, the mixture was subjected to gravity filtration. The obtained filtrate was condensed to give an oily light brown substance. The obtained oily substance was dried under reduced pressure to give 7.5 g of a light brown solid, which was the object of the synthesis, at a yield of 86%. A synthesis scheme of Step 1 is shown in (A-1) given below.

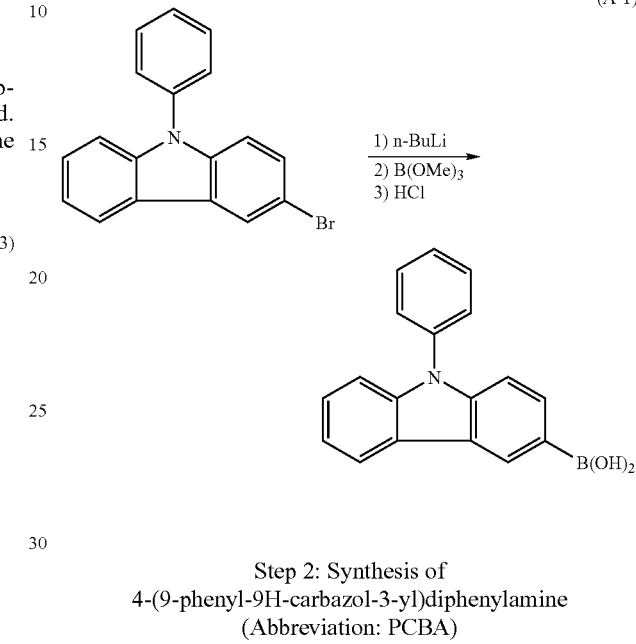

Step 2: Synthesis of
4-(9-phenyl-9H-carbazol-3-yl)diphenylamine
(Abbreviation: PCBA)

Into a 500 mL three-neck flask was put 6.5 g (26 mmol) of 4-bromo-diphenylamine, 7.5 g (26 mmol) of 9-phenyl-9H-carbazole-3-boronic acid, which was synthesized in Step 1, and 400 mg (1.3 mmol) of tri(o-tolyl)phosphine. The atmosphere in the flask was substituted by nitrogen. To the mixture were added 100 mL of toluene, 50 mL of ethanol, and 14 mL (0.2 mol/L) of an aqueous potassium carbonate solution. Under reduced pressure, this mixture was degassed while being stirred. After the degassing, 67 mg (30 mmol) of palladium(II) acetate was added to the mixture. This mixture was refluxed at 100° C. for 10 hours. After the reflux, an aqueous layer of the mixture was extracted with toluene, and the extract was combined with an organic layer and then washed with a saturated saline solution. The organic layer was dried with magnesium sulfate. After the drying, this mixture was subjected to gravity filtration. The obtained filtrate was condensed to give an oily light brown substance. This oily substance was purified by silica gel column chromatography (a developing solvent was a mixed solvent of hexane:toluene=4:6). A white solid obtained after the purification was recrystallized with a mixed solvent of dichloromethane and hexane to give PCBA as 4.9 g of a white solid, at a yield of 45%. A synthesis scheme of Step 2 is shown in (A-2) given below.

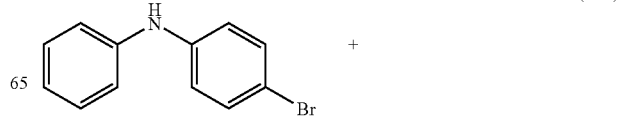

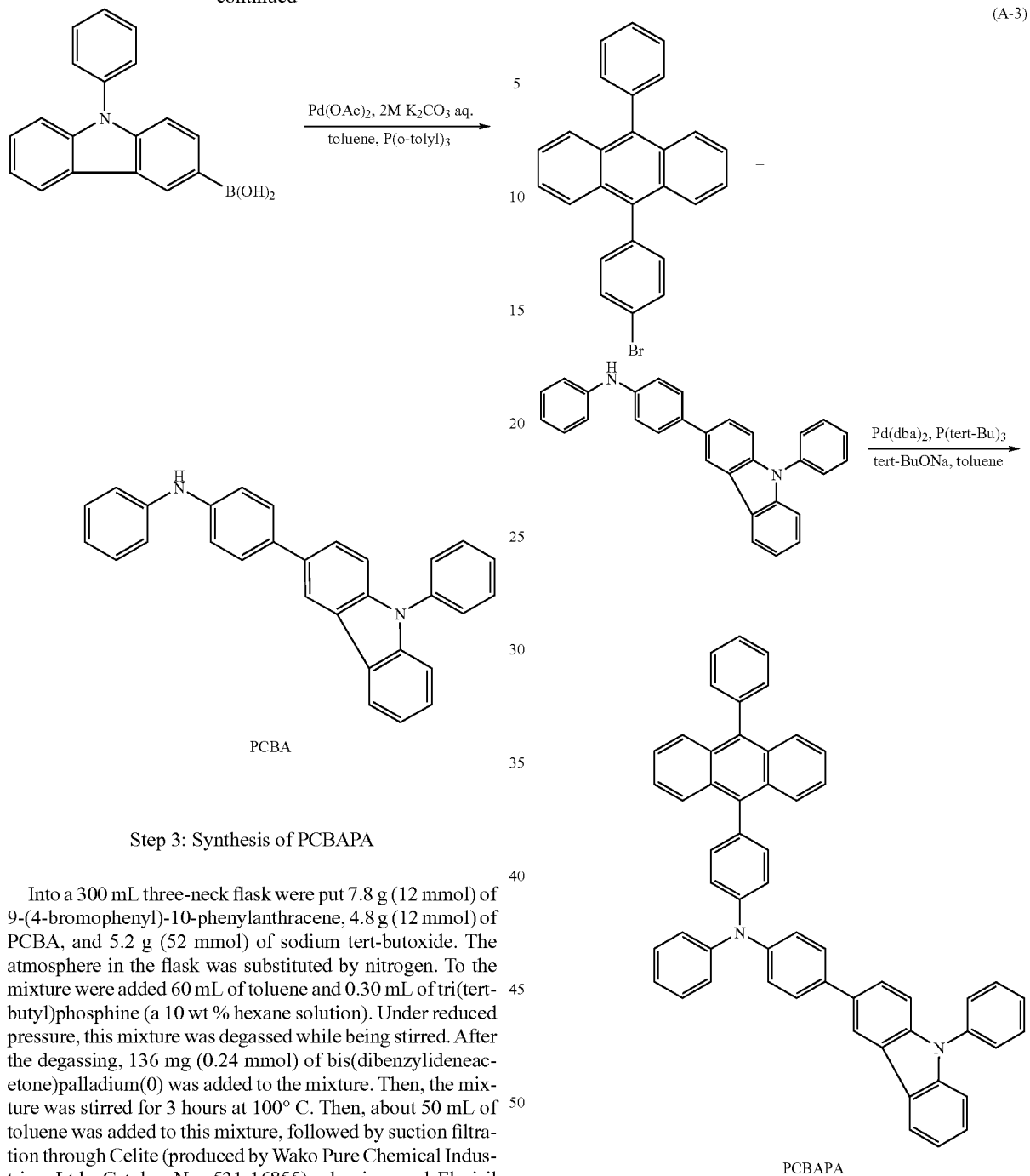

Step 3: Synthesis of PCBAPA

Into a 300 mL three-neck flask were put 7.8 g (12 mmol) of 9-(4-bromophenyl)-10-phenylanthracene, 4.8 g (12 mmol) of PCBA, and 5.2 g (52 mmol) of sodium tert-butoxide. The atmosphere in the flask was substituted by nitrogen. To the mixture were added 60 mL of toluene and 0.30 mL of tri(tert-butyl)phosphine (a 10 wt % hexane solution). Under reduced pressure, this mixture was degassed while being stirred. After the degassing, 136 mg (0.24 mmol) of bis(dibenzylideneacetone)palladium(0) was added to the mixture. Then, the mixture was stirred for 3 hours at 100° C. Then, about 50 mL of toluene was added to this mixture, followed by suction filtration through Celite (produced by Wako Pure Chemical Industries, Ltd., Catalog No. 531-16855), alumina, and Florisil (produced by Wako Pure Chemical Industries, Ltd., Catalog No. 540-00135). The obtained filtrate was condensed to give a yellow solid. The solid substance was recrystallized with a mixed solvent of toluene and hexane, so that 6.6 g of a light yellow solid substance of PCBAPA, which was the object of the synthesis, was obtained at a yield of 75%. Then, 3.0 g of the obtained light yellow powdered solid was sublimated and purified by a train sublimation method. For sublimation purification conditions, PCBAPA was heated at 350° C. under a pressure of 8.7 Pa with a flow rate of argon gas of 3.0 mL/min. After the sublimation purification, 2.7 g of a light yellow solid of PCBAPA was obtained at a yield of 90%. A synthesis scheme of Step 3 is shown in (A-3) given below.

$^1$H NMR spectrum of the solid substance obtained in the above Step 3 was measured. The measurement data are described below. From the measurement results, it can be seen that the PCBAPA represented by the above structural formula (3) was obtained.

$^1$H NMR (CDCl$_3$, 300 MHz): δ=7.09-7.14 (m, 1H), 7.28-7.72 (m, 33H), 7.88 (d, J=8.4 Hz, 2H), 8.19 (d, J=7.2 Hz, 1H), 8.37 (d, J=1.5 Hz, 1H).

This application is based on Japanese Patent Application serial No. 2008-320934 filed with the Japan Patent Office on Dec. 17, 2008, the entire contents of which are hereby incorporated by reference.

What is claimed is:

1. A light-emitting element comprising:
an anode;
a cathode; and
a layer comprising an organic compound between the anode and the cathode,
wherein the layer comprises at least a light-emitting layer in which a first layer, a second layer, and a third layer are stacked from the anode side,
wherein the first layer comprises a first light-emitting substance and a first organic compound,
wherein the second layer comprises a second light-emitting substance and a second organic compound,
wherein the third layer comprises the first light-emitting substance and a third organic compound,
wherein an amount of the first light-emitting substance is larger than an amount of the first organic compound in the first layer,
wherein an amount of the second organic compound is larger than an amount of the second light emitting substance in the second layer,
wherein an amount of the third organic compound is larger than the amount of the first light-emitting substance in the third layer,
wherein the first light-emitting substance has a hole-transporting property,
wherein the first organic compound has a hole-transporting property,
wherein the first light-emitting substance is a substance represented by the following general formula (i),

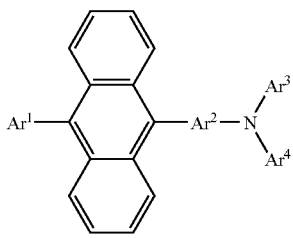

wherein $Ar^1$ represents an aryl group having 6 to 25 carbon atoms, $Ar^2$ represents an arylene group having 6 to 25 carbon atoms, and $Ar^3$ and $Ar^4$ independently represent an aryl group having 6 to 25 carbon atoms or a carbazolyl group.

2. The light-emitting element according to claim 1,
wherein the first layer and the second layer has a hole-transporting property, and
wherein the third layer has an electron-transporting property.

3. The light-emitting element according to claim 1,
wherein the first light-emitting substance and the second organic compound are materials which have a hole-transporting property, and
wherein the third organic compound is a material which has an electron-transporting property.

4. The light-emitting element according to claim 1,
wherein a hole-transporting layer is provided in contact with the first layer, and
wherein the second organic compound is a condensed polycyclic substance.

5. The light-emitting element according to claim 1,
wherein a peak wavelength of light emitted from the first light-emitting substance is in a range of 400 nm to 480 nm, and
wherein a peak wavelength of light emitted from the second light-emitting substance is in a range of 540 nm to 600 nm.

6. The light-emitting element according to claim 1,
wherein a peak wavelength of light emitted from the first light-emitting substance is in a range of 480 nm to 520 nm, and
wherein a peak wavelength of light emitted from the second light-emitting substance is in a range of 600 nm to 700 nm.

7. The light-emitting element according to claim 1,
wherein a light which the light-emitting element emits is a white light.

8. A lighting device using the light-emitting element according to claim 1.

9. An electronic apparatus comprising a light-emitting device provided with the light-emitting element according to claim 1 and a means for controlling light emission from the light-emitting element.

10. A light-emitting element comprising:
an anode;
a cathode; and
a layer comprising an organic compound between the anode and the cathode,
wherein the layer comprises at least a light-emitting layer in which a first layer, a second layer, and a third layer are stacked from the anode side,
wherein the first layer comprises a first light-emitting substance,
wherein the second layer comprises a second light-emitting substance and a second organic compound,
wherein the third layer comprises the first light-emitting substance and a third organic compound,
wherein an amount of the second organic compound is larger than an amount of the second light-emitting substance in the second layer,
wherein an amount of the third organic compound is larger than the amount of the first light-emitting substance in the third layer,
wherein the first light-emitting substance has a hole-transporting property, wherein the first light-emitting substance is a substance represented by the following general formula (i),

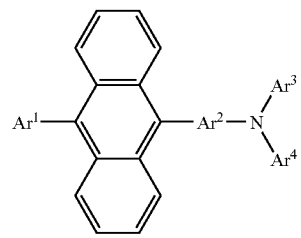

wherein $Ar^1$ represents an aryl group having 6 to 25 carbon atoms, $Ar^2$ represents an arylene group having 6 to 25 carbon atoms, and $Ar^3$ and $Ar^4$ independently represent an aryl group having 6 to 25 carbon atoms or a carbazolyl group.

11. The light-emitting element according to claim 10,
wherein the first layer and the second layer has a hole-transporting property, and
wherein the third layer has an electron-transporting property.

12. The light-emitting element according to claim 10,
wherein the first light-emitting substance and the second organic compound are materials which have a hole-transporting property, and
wherein the third organic compound is a material which has an electron-transporting property.

13. The light-emitting element according to claim 10,
wherein a hole-transporting layer is provided in contact with the first layer, and
wherein the second organic compound is a condensed polycyclic substance.

14. The light-emitting element according to claim 10,
wherein a peak wavelength of light emitted from the first light-emitting substance is in a range of 400 nm to 480 nm, and
wherein a peak wavelength of light emitted from the second light-emitting substance is in a range of 540 nm to 600 nm.

15. The light-emitting element according to claim 10,
wherein a peak wavelength of light emitted from the first light-emitting substance is in a range of 480 nm to 520 nm, and
wherein a peak wavelength of light emitted from the second light-emitting substance is in a range of 600 nm to 700 nm.

16. The light-emitting element according to claim 10,
wherein a light which the light-emitting element emits is a white light.

17. A lighting device using the light-emitting element according to claim 10.

18. An electronic apparatus comprising a light-emitting device provided with the light-emitting element according to claim 10 and a means for controlling light emission from the light-emitting element.

19. A light-emitting element comprising:
an anode;
a cathode; and
a layer comprising an organic compound between the anode and the cathode,
wherein the layer comprises at least a light-emitting layer in which a first layer, a second layer, and a third layer are stacked from the anode side,
wherein the first layer comprises a first light-emitting substance and a first organic compound,
wherein the second layer comprises a second light-emitting substance and a second organic compound,
wherein the third layer comprises the first light-emitting substance and a third organic compound,
wherein a rate of the first light-emitting substance in the first layer is higher than or equal to 50 wt % and lower than 100 wt %,
wherein a rate of the second organic compound in the second layer is higher than or equal to 50 wt % and lower than 100 wt %,
wherein a rate of the third organic compound in the third layer is higher than or equal to 50 wt % and lower than 100 wt %,
wherein the first light-emitting substance has a hole-transporting property, and
wherein the first organic compound has a hole-transporting property.

20. The light-emitting element according to claim 19,
wherein the first layer and the second layer has a hole-transporting property, and
wherein the third layer has an electron-transporting property.

21. The light-emitting element according to claim 19,
wherein the first light-emitting substance and the second organic compound are materials which have a hole-transporting property, and
wherein the third organic compound is a material which has an electron-transporting property.

22. The light-emitting element according to claim 19,
wherein the first light-emitting substance is a substance represented by the following general formula (i), $$Ar^1-\text{anthracene}-Ar^2-N(Ar^3)(Ar^4) \tag{i}$$

wherein $Ar^1$ represents an aryl group having 6 to 25 carbon atoms, $Ar^2$ represents an arylene group having 6 to 25 carbon atoms, and $Ar^3$ and $Ar^4$ independently represent an aryl group having 6 to 25 carbon atoms or a carbazolyl group.

23. The light-emitting element according to claim 1,
wherein a hole-transporting layer is provided in contact with the first layer, and
wherein the second organic compound is a condensed polycyclic substance.

24. The light-emitting element according to claim 19,
wherein a peak wavelength of light emitted from the first light-emitting substance is in a range of 400 nm to 480 nm, and
wherein a peak wavelength of light emitted from the second light-emitting substance is in a range of 540 nm to 600 nm.

25. The light-emitting element according to claim 19,
wherein a peak wavelength of light emitted from the first light-emitting substance is in a range of 480 nm to 520 nm, and
wherein a peak wavelength of light emitted from the second light-emitting substance is in a range of 600 nm to 700 nm.

26. The light-emitting element according to claim 19,
wherein a light which the light-emitting element emits is a white light.

27. A lighting device using the light-emitting element according to claim 19.

28. An electronic apparatus comprising a light-emitting device provided with the light-emitting element according to claim 19 and a means for controlling light emission from the light-emitting element.

29. A light-emitting element comprising:
an anode;
a cathode; and
a layer comprising an organic compound between the anode and the cathode, wherein the layer comprises at least a light-emitting layer in which a first layer, a second layer, and a third layer are stacked from the anode side, wherein the first layer comprises a first light-emitting substance, wherein the second layer comprises a second light-emitting substance and a second organic compound, wherein the third layer comprises the first light-emitting substance and a third organic compound, wherein a rate of the second organic compound in the second layer is higher than or equal to 50 wt % and lower than 100 wt %, wherein a rate of the third organic compound in the third layer is higher than or equal to 50 wt % and lower than 100 wt %, and wherein the first light-emitting substance has a hole-transporting property.

30. The light-emitting element according to claim 29, wherein the first layer and the second layer has a hole-transporting property, and wherein the third layer has an electron-transporting property.

31. The light-emitting element according to claim 29, wherein the first light-emitting substance and the second organic compound are materials which have a hole-transporting property, and wherein the third organic compound is a material which has an electron-transporting property.

32. The light-emitting element according to claim 29, wherein the first light-emitting substance is a substance represented by the following general formula (i),

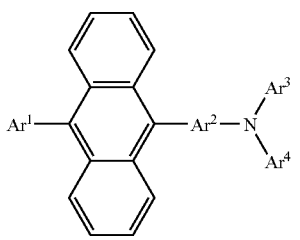

(i)

wherein $Ar^1$ represents an aryl group having 6 to 25 carbon atoms, $Ar^2$ represents an arylene group having 6 to 25 carbon atoms, and $Ar^3$ and $Ar^4$ independently represent an aryl group having 6 to 25 carbon atoms or a carbazolyl group.

33. The light-emitting element according to claim 29, wherein a hole-transporting layer is provided in contact with the first layer, and wherein the second organic compound is a condensed polycyclic substance.

34. The light-emitting element according to claim 29, wherein a peak wavelength of light emitted from the first light-emitting substance is in a range of 400 nm to 480 nm, and wherein a peak wavelength of light emitted from the second light-emitting substance is in a range of 540 nm to 600 nm.

35. The light-emitting element according to claim 29, wherein a peak wavelength of light emitted from the first light-emitting substance is in a range of 480 nm to 520 nm, and wherein a peak wavelength of light emitted from the second light-emitting substance is in a range of 600 nm to 700 nm.

36. The light-emitting element according to claim 29, wherein a light which the light-emitting element emits is a white light.

37. A lighting device using the light-emitting element according to claim 29.

38. An electronic apparatus comprising a light-emitting device provided with the light-emitting element according to claim 29 and a means for controlling light emission from the light-emitting element.

* * * * *

UNITED STATES PATENT AND TRADEMARK OFFICE
CERTIFICATE OF CORRECTION

PATENT NO. : 8,581,237 B2  
APPLICATION NO. : 12/639312  
DATED : November 12, 2013  
INVENTOR(S) : Takahiro Ushikubo and Nobuharu Ohsawa Page 1 of 1

It is certified that error appears in the above-identified patent and that said Letters Patent is hereby corrected as shown below:

In the Specification:

Column 10, line 32 to 33; Change "phenyl-N-phenylamino}" to --phenyl-N'-phenylamino}--.  
Column 10, line 34; Change "[N,N-bis" to --[N,N'-bis--.  
Column 17, line 49; Change "DTPPA);" to --DTDPPA);--.  
Column 17, line 54; Change "abbreviation" to --abbreviation:--.  
Column 19, line 6; Change "2-tent-butyl" to --2-tert-butyl--.  
Column 19, line 44; Change "DMA," to --DPhPA,--.  
Column 20, line 4; Change "$cm^{-2}/Vs$" to --$cm^2/Vs$--.  
Column 21, line 19; Change "$\Omega \cdot m$." to --$\Omega$ cm.--.  
Column 25, line 36; Change "mariner" to --manner--.  
Column 26, line 19; Change "AFT" to --TFT--.  
Column 27, line 30; Change "described Embodiment" to --described in Embodiment--.  
Column 35, line 57; Change "30 mm." to --30 nm.--.

In the Claims:

Column 44, line 34, Claim 23; Change "claim 1," to --claim 19,--.

Signed and Sealed this  
Eighteenth Day of March, 2014

Michelle K. Lee  
*Deputy Director of the United States Patent and Trademark Office*